United States Patent
Blanchard et al.

(10) Patent No.: US 12,308,765 B1
(45) Date of Patent: May 20, 2025

(54) IONIC LIQUID-BASED PIEZOELECTRIC APPARATUS AND RELATED METHODS

(71) Applicant: BOARD OF TRUSTEES OF MICHIGAN STATE UNIVERSITY, East Lansing, MI (US)

(72) Inventors: Gary J. Blanchard, Okemos, MI (US); Md. Iqbal Hossain, Lafayette, IN (US); Marcos Dantus, Okemos, MI (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 0 days.

(21) Appl. No.: 18/694,606

(22) PCT Filed: Oct. 5, 2023

(86) PCT No.: PCT/US2023/034514
§ 371 (c)(1),
(2) Date: Mar. 22, 2024

(87) PCT Pub. No.: WO2024/076661
PCT Pub. Date: Apr. 11, 2024

Related U.S. Application Data

(60) Provisional application No. 63/471,553, filed on Jun. 7, 2023, provisional application No. 63/413,334, filed on Oct. 5, 2022.

(51) Int. Cl.
*H02N 2/18* (2006.01)
(52) U.S. Cl.
CPC ................................ *H02N 2/18* (2013.01)
(58) Field of Classification Search
CPC .... H10N 30/30; H10N 30/302; H10N 30/304; H10N 30/306; H10N 30/308; H02N 2/18;
(Continued)

(56) References Cited

U.S. PATENT DOCUMENTS 10,680,161 B1 6/2020 Bharadwaj
2007/0120450 A1* 5/2007 Hattori ................ H02N 11/006
310/800
(Continued)

FOREIGN PATENT DOCUMENTS

JP 2022035144 A 3/2022

OTHER PUBLICATIONS

Choi, Liquid salts bring push-button lenses into focus > first-ever piezoelectric liquids could spark new technologies in optics and hydraulics, IEEE Spectrum Web, pp. 1-7 (Mar. 25, 2023).
(Continued)

*Primary Examiner* — Derek J Rosenau
(74) *Attorney, Agent, or Firm* — MARSHALL, GERSTEIN & BORUN LLP

(57) ABSTRACT

The disclosure relates to piezoelectric apparatus containing ionic liquids. The piezoelectric apparatus includes a chamber defining an internal volume containing an ionic liquid therein. The ionic liquid can generate a voltage or current upon application of force to the chamber or cell, thus exhibiting a piezoelectric effect. The ionic liquid also can deform upon application of a voltage to the ionic liquid, thus exhibiting a converse piezoelectric effect. The piezoelectric apparatus further includes first and second electrodes in contact with the ionic liquid at first and second locations, such as at opposing locations in the chamber with the ionic liquid positioned between the electrodes. The piezoelectric apparatus, depending on whether it is configured to exhibit a piezoelectric effect or a converse piezoelectric effect, can form or otherwise be a component of various energy or sensing devices, such as an energy harvester, force sensor, piezo-pneumatic device or actuator, optical sensor, etc.

38 Claims, 15 Drawing Sheets

(58) Field of Classification Search
CPC ........ H02N 2/181; H02N 2/183; H02N 2/185; H02N 2/186; H02N 2/188
USPC .......................................................... 310/339
See application file for complete search history.

(56) References Cited

U.S. PATENT DOCUMENTS

2013/0135399 A1   5/2013   Lee et al.
2019/0265530 A1   8/2019   Blanchard et al.

OTHER PUBLICATIONS

Hossain, Ionic liquids exhibit the pieoelectric effect, J. Phys. Chem. Lett., 14(11):2731-5 (Mar. 9, 2023).

International Application No. PCT/US2023/034514, International Search Report and Written Opinion, mailed Feb. 22, 2024.

Ma et al., Charge-Induced Long-Range Order in a Room-Temperature Ionic Liquid, Langmuir, 32:9507-12 (2016) (abstract only).

Ma et al., Ionic Liquids: A unique and useful class of materials, Chem. Educator, 23:265-72 (2018).

Seki et al., Comprehensive Refractive Index Property for Room-Temperature Ionic Liquids, J. Chem. Eng. Data, 57:2211-6 (2012) (abstract only).

Liu et al., "High-porosity Foam-based iontronic pressure sensor with superhigh sensitivity of 9280 $kPa^{-1}$," Nano-Micro Letters, 14:21 (2022).

Fukagawa et al., "Anomalous piezoelectric properties of poly(vinylidene fluoride-trifluoroethylene)/ionic liquid gels," Japanese Journal of Applied Physics, vol. 57, issue 4S, p. 04FL06 (2018) (abstract only).

\* cited by examiner

| Ionic Liquid | m.p. (°C) | ρ (g/cm³) | $V_{cation}$ (Å³) | $V_{anion}$ (Å³) |
|---|---|---|---|---|
| EMIM⁺BF₄⁻ | 15 | 1.29 | 117 | 50 |
| EMIM⁺TFSI⁻ | -15 | 1.53 | 117 | 166 |
| BMIM⁺BF₄⁻ | -71 | 1.21 | 151 | 50 |
| BMIM⁺TFSI⁻ | -2 | 1.45 | 151 | 166 |
| HMIM⁺BF₄⁻ | -83 | 1.15 | 185 | 50 |
| HMIM⁺TFSI⁻ | -9 | 1.38 | 185 | 166 |
| OMIM⁺BF₄⁻ | -88 ($T_g$) | 1.12 | 219 | 50 |
| OMIM⁺TFSI⁻ | -85 ($T_g$) | 1.32 | 219 | 166 |

IONIC LIQUID-BASED PIEZOELECTRIC APPARATUS AND RELATED METHODS

CROSS REFERENCE TO RELATED APPLICATION

This is a US national stage of International Application No. PCT/US2023/034514, filed Oct. 5, 2023, which claims priority to U.S. Provisional Application Nos. 63/413,334 (filed Oct. 5, 2022) and 63/471,553 (filed Jun. 7, 2023), each of which is incorporated herein by reference in its entirety.

STATEMENT OF GOVERNMENT INTEREST

None.

BACKGROUND OF THE DISCLOSURE

Field of the Disclosure

The disclosure relates to piezoelectric apparatus including ionic liquids contained therein. The piezoelectric apparatus includes a chamber defining an internal volume containing an ionic liquid therein. The ionic liquid can generate a voltage or current upon application of force to the chamber or cell, thus exhibiting a piezoelectric effect. The ionic liquid also can deform upon application of a voltage to the ionic liquid, thus exhibiting a converse piezoelectric effect.

Brief Description of Related Technology

The piezoelectric effect has been known since 1880 and it has found wide application in areas ranging from spark sources to nanoactuators and biosensors. The direct piezoelectric effect produces a charge separation in a material upon application of force, and this is understood to occur based on the distortion of the material structure on the unit cell or molecular scale. This effect is seen in noncentrosymmetric crystalline materials, such as quartz, $LiNbO_3$, $BaTiO_3$, and $Pb[Zr_xTi_{1-x}]O_3$ ($0 \leq x \leq 1$) (PZT) and also in some ceramics, nanomaterials, polymers, composites, and in non-crystalline materials including DNA, viral proteins, and amino acids.

Materials that exhibit the direct piezoelectric effect also exhibit the converse piezoelectric effect, where the application of charge to a material causes a bulk physical distortion, and this effect has found use in many applications, especially in nanoactuators and other small-amplitude motion-control applications. In all known examples of the direct and converse piezoelectric effects, the material manifesting these effects is a solid.

SUMMARY

In one aspect, the disclosure relates to a piezoelectric apparatus comprising: a chamber defining an internal volume (e.g., chamber or cell having one or more walls defining a space or volume containing a piezoelectric ionic liquid therein); an ionic liquid (or piezoelectric ionic liquid) in the internal volume, the ionic liquid being adapted to generate either (i) a voltage or current upon application of force to the chamber or cell (i.e., piezoelectric effect), or (ii) a deformation of the ionic liquid upon application of a voltage to the ionic liquid (i.e., converse piezoelectric effect); a first electrode in contact with the ionic liquid at a first location; and a second electrode in contact with the ionic liquid at a second location.

Various refinements of the disclosed piezoelectric apparatus are possible.

In a refinement, the ionic liquid comprises a cationic moiety selected from the group consisting of a pyridinium, pyridazinium, pyrimidinium, pyrazinium, oxazinium, thiazinium, imidazolium, pyrazolium, thiazolium, isothiazolium, oxazolium, isoxazolium, triazolium, pyrrolium, pyrrolidinium, isoquinolinium, pyrimidoazepinium, piperidinium, ammonium, phosphonium, and sulfonium cationic moieties (e.g., substituted or unsubstituted cationic groups, such as at the N, P, or S atoms thereof). For example, the cationic moiety can comprise one or more organic substituents each independently selected from the group consisting of alkyl groups (e.g., linear, branched, or cyclic, substituted or unsubstituted groups with 1-20, 2-10, or 3-6 carbon atoms) and aryl groups (e.g., substituted or unsubstituted groups with 5-20, 6-15, or 6-10 carbon atoms).

In a refinement, the ionic liquid comprises a counter anion selected from the group consisting of sulfate, hydrogen sulfate, nitrate, fluoride, chloride, bromide, iodide, methyl sulfonate (e.g., alkyl or aryl sulfonate more generally), cyanide, cyanate, thiocyanate, bis(trifluoromethanesulfonyl) imide (triflimide), fluoroborate anions (e.g., tetrafluoroborate, or haloborate anions more generally), fluorophosphate anions (e.g., hexafluorophosphate, or halophosphate anions more generally), and trifluoromethyl sulfonate (triflate). For example, the ionic liquid can comprise a counter anion containing an anionic moiety, the anionic moiety comprising one or more organic substituents each independently selected from the group consisting of alkyl groups (e.g., linear, branched, or cyclic, substituted or unsubstituted groups with 1-20, 2-10, or 3-6 carbon atoms) and aryl groups (e.g., substituted or unsubstituted groups with 5-20, 6-15, or 6-10 carbon atoms).

In a refinement, the ionic liquid comprises a counter anion containing (i) one or more B, N, P, or S atoms (e.g., 1, 2, 3, 4, 5, or 6 of B, N, P, and/or S atoms), (ii) one or more halogen atoms (e.g., F in particular), (iii) optionally one or more carbon atoms (e.g., 1-20, 2-12, or 3-6 carbon atoms, such as in (per)halo- or (per)fluorocarbon groups), and (iv) optionally one or more O atoms (e.g., 1-20, 2-12, or 3-6 oxygen atoms, such as bound to the B, N, P, or S atoms).

In a refinement, the ionic liquid exhibits a piezoelectric constant ($d_{33}$) of at least 0.01 pC/N (e.g., 0.01-30, 0.02-20, 0.1-10, 0.2-5, or 0.3-3 pC/N, such as at least 0.01, 0.02, 0.05, 0.1, 0.2, 0.3, 0.5, 0.7, 1, 1.5, 2, or 3 and/or up to 0.2, 0.4, 0.6, 0.8, 1, 1.3, 1.7, 2, 3, 5, 7, 10, 20, or 30 pC/N).

In a refinement, the internal volume is substantially free from materials other than ionic liquids.

In a refinement, the piezoelectric apparatus further comprises a porous, flexible solid substrate in the internal volume.

In a refinement, the internal volume is substantially free from a headspace (e.g., substantially no (continuous) gaseous phase or void volume above (e.g., relative to gravity) the ionic liquid phase; but can include encased/enclosed discrete gaseous regions such as in foamed/porous solid substrate in the internal volume).

In a refinement, the first electrode and the second electrode are positioned at opposing locations in the internal volume.

In a refinement, the first electrode and the second electrode each independently comprise a metal material (e.g., single or multiple metals or alloys such as steel; other electrically conductive materials such as conductive polymers, carbon electrodes, etc. can be used; the same or different materials can be selected for the first and second electrodes).

In a refinement, the first electrode and the second electrode each independently comprise a material selected from the group consisting of metal materials, transparent conductive metal oxides, conductive polymers, semiconducting diamonds, conductive carbons, transparent conductive carbons, and combinations thereof (e.g., where the same or different materials can be selected for the first and second electrodes).

In a refinement, the first electrode and the second electrode each independently comprise a transparent conductive metal oxide selected from the group consisting of indium tin oxide (ITO), fluorine-doped indium tin oxide (FTO), indium zinc oxide (IZO), and aluminum zinc oxide (AZO) (e.g., where the same or different materials can be selected for the first and second electrodes).

In a refinement, the internal volume (or chamber) has at least one linear dimension of at least 0.01 m. Alternatively or additionally, a distance between the first electrode and the second electrode in a range of 0.05 mm to 2 mm (e.g., or more generally between 0.0005 mm and 10 mm).

In a refinement, the piezoelectric apparatus further comprises an external electrical load in electrical connection with the first electrode and the second electrode; optionally, the chamber comprises one or more flexible (e.g., deformable or translatable) wall segments (e.g., defining a deformable internal volume in the chamber based on external applied force); and optionally, the first electrode and the second electrode are not in electrical connection with an external voltage or power source. This can represent an embodiment in which electrodes attached to the cell are connected to an external electrical load driven by piezoelectric voltage upon application of force to the cell (e.g., in an energy harvesting, power generation, or sensing application). In a further refinement, the chamber of the piezoelectric apparatus comprises at least one deformable or translatable wall (e.g., a flexible solid material as a wall, a slidable/translatable piston structure in a tube/conduit, etc. so that the chamber and internal volume deforms or contracts when force is applied to the ionic liquid). This can represent an embodiment in which a piezoelectric apparatus has a piston-like structure, for example as a component of or replacement for a shock absorber in a transportation vehicle (car, truck, etc.) in which the apparatus provides both shock absorption and piezoelectric energy generation from each compression when driving. The electrical load can be the electrical system of the vehicle and/or a battery, such that the piezoelectric apparatus and associated electrical circuitry provides conversion of mechanical energy to electrical energy or electrical energy storage.

In a refinement, the piezoelectric apparatus further comprises an external voltage source in electrical connection with the first electrode and the second electrode (e.g., where the voltage source is adapted to apply a voltage differential between electrodes and induce an electrical current through the ionic liquid, thereby inducing the converse piezoelectric effect); and the chamber of the piezoelectric apparatus comprises at least one deformable or translatable wall (e.g., a flexible solid material as a wall, a slidable/translatable piston structure in a tube/conduit, etc. so that the chamber and internal volume deforms/expands when voltage is applied to the ionic liquid). This can represent an embodiment in which electrodes attached to the cell are connected to an external electrical power source that induces ionic liquid deformation via the converse piezoelectric effect upon application of a voltage to the ionic liquid from the power source (e.g., in a piezo-pneumatic device for hydraulics, sensing, or actuation).

In a refinement, at least one of the first electrode and the second electrode (e.g., both electrodes) is chemically modified to control the long range (e.g., micrometers or longer) molecular organization of the piezoelectric ionic liquid in contact with the at least one of the first electrode and the second electrode. In a further refinement, the at least one of the first electrode and the second electrode is chemically modified with a chiral or otherwise optically active chemical modifier.

In another aspect, the disclosure relates to a plurality of piezoelectric apparatus of any disclosed aspect, refinement, etc., wherein the chamber of each piezoelectric apparatus is separate from the other chambers (e.g., internal volumes and ionic liquids therein are separate/segregated from each other (or otherwise not in fluid contact or fluid communication with each other) in a known/selected spatial pattern such that an applied force and corresponding piezoelectric effect voltage can be correlated to a known location, for example in a spatially specific sensing application, such as for a touch-sensitive display on a computer, tablet, smart phone, or other computing device).

In another aspect, the disclosure relates to a plurality of piezoelectric apparatus of any disclosed aspect, refinement, etc., wherein the chamber of each piezoelectric apparatus is separate from the other chambers (e.g., internal volumes and ionic liquids therein are separate/segregated from each other (or otherwise not in fluid contact or fluid communication with each other) in an arrangement where the chambers can be (electrically) connected either in series or in parallel (e.g., serial and/or parallel electrical connections between first and/or second electrodes of the different piezoelectric apparatus).

While the disclosed articles, apparatus, and methods are susceptible of embodiments in various forms, specific embodiments of the disclosure are illustrated (and will hereafter be described) with the understanding that the disclosure is intended to be illustrative, and is not intended to limit the claims to the specific embodiments described and illustrated herein.

BRIEF DESCRIPTION OF THE DRAWINGS

For a more complete understanding of the disclosure, reference should be made to the following detailed description and accompanying drawings wherein.

DETAILED DESCRIPTION

The disclosure relates to piezoelectric apparatus including ionic liquids contained therein. The piezoelectric apparatus includes a chamber defining an internal volume containing an ionic liquid (or piezoelectric ionic liquid) therein. The chamber can be any suitable cell or container having one or more walls defining a space or volume containing the ionic liquid. The ionic liquid can generate a voltage or current upon application of force to the chamber or cell, thus exhibiting a piezoelectric effect. The ionic liquid also can deform (e.g., expand the volume of the ionic liquid) upon application of a voltage to the ionic liquid, thus exhibiting a converse piezoelectric effect. The piezoelectric apparatus further includes first and second electrodes in contact with the ionic liquid at first and second (different) locations, typically at opposing locations in the chamber with the ionic liquid positioned between the electrodes. The piezoelectric apparatus, depending on whether it is configured to exhibit a piezoelectric effect or a converse piezoelectric effect, can form or otherwise be a component of various energy or sensing devices, such as an energy harvester, force sensor, piezo-pneumatic device or actuator, optical sensor, etc.

Piezoelectric Apparatus

Figure 1:
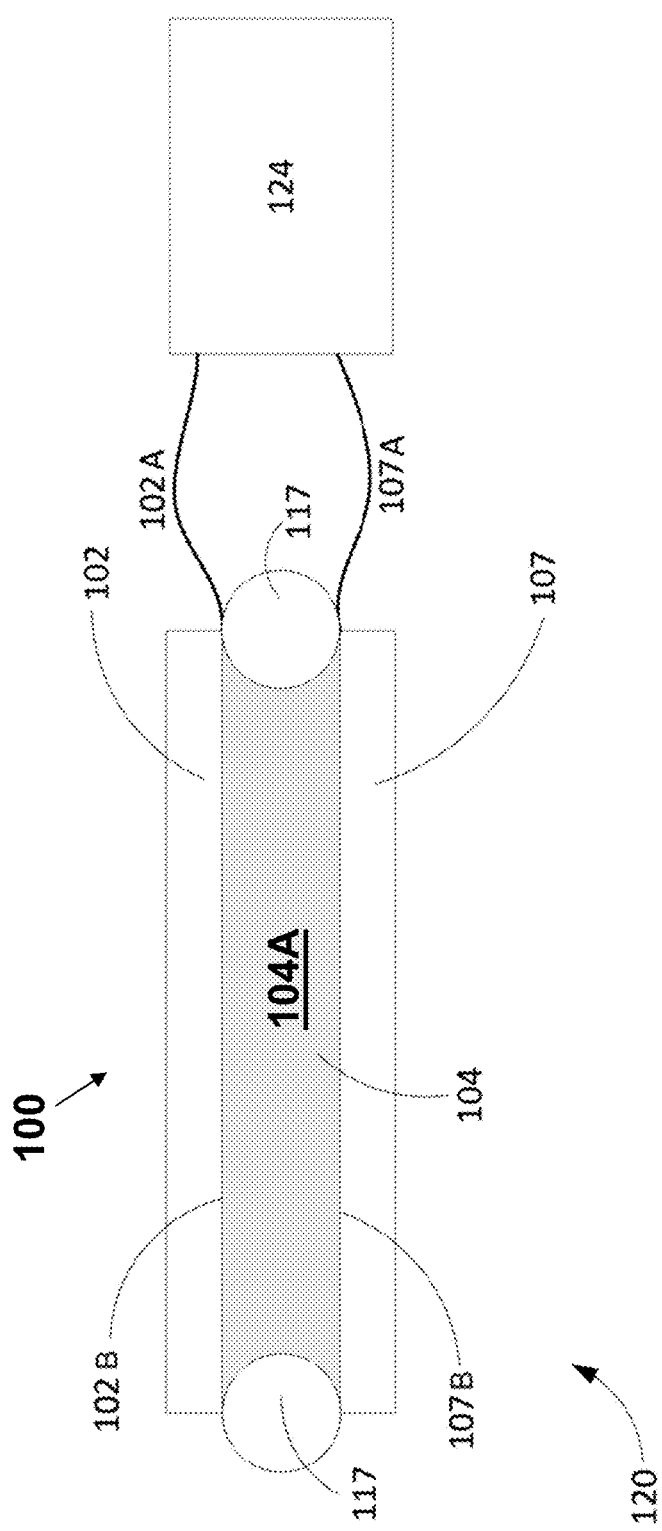
FIG. 1 illustrates a piezoelectric apparatus according to the disclosure.

FIG. 1 is a side view of an embodiment of a piezoelectric apparatus 100 including a cell or chamber 120 defining an internal volume 104 containing an ionic liquid 104A therein. As illustrated, the chamber 120 includes two structural components defining the internal volume 104, in particular a first substrate or wall 102 and an opposing second substrate or wall 107. The internal volume 104 is defined as the volume between the first and second substrates 102, 107. A sealing structure 117 (e.g., an electrically insulating sealing structure) may separate the first substrate 102 and the second substrate 107 and provide side walls or a seal around the internal volume 104 allowing the internal volume 104 to contain the RTIL 104A. One example of a suitable sealing structure 117 for sealing the internal volume 104 is a synthetic rubber O-ring. In other embodiments the first and second substrates 102 and 107 may have extending side walls or be a single piece of a material. In any embodiment, it is desirable for the first and second substrates 102 and 107 to be electrically independent and, therefore, that no significant electrical current flows or is capable of flowing through the internal volume 104, sealing structure 117, or sidewalls from the first and second substrates 102 and 107. Therefore, it is generally desirable that the sealing structure 117 be electrically non-conductive (e.g., a rubber O-ring). The sealing structure may also be held in place by a clamp or pressure from the first and second substrates 102 and 107, by an adhesive, by a mechanical fastener, or any other way to hold the sealing structure 117 in place and to seal the internal volume 104.

The piezoelectric apparatus 100 further includes first electrode 102A in contact with the ionic liquid 104A at first location; and a second electrode 107A in contact with the ionic liquid 104A as a second location. In some embodiments, the first and second electrodes 102A, 107A can be discrete or separate structures relative to the first and second substrates 102, 107, but which are in contact with the ionic liquid 104A. In some embodiments, the first and second electrodes 102A, 107A can form or be a portion of the first and second substrates 102, 107 that are in contact with the ionic liquid 104A. Suitably, the first electrode 102 and the second electrode 107 are positioned at opposing locations in the internal volume 104, for example including planar or flat electrodes on or at opposing interior chamber walls.

The first and second electrodes 102A, 107A can be any electrically conducting material or structure inserted/extending into the internal volume 104 and ionic liquid 104A, coated or bound to an interior wall of the chamber 120, etc. The first and second electrodes 102A, 107A are generally different structures and/or spaced apart from each other at different locations in the internal volume 104 and/or ionic liquid 104A. The first and second electrodes 102A, 107A are generally not in direct electrical contact with each other via wiring, etc., but they can be indirectly in electrical connection via an external electrical device 124, for example and external electrical load 124B (e.g., when the generated piezoelectric effect drives/powers an external electrical device) or via an external voltage or power source 124A (e.g., which can be used to induce a converse piezoelectric effect in the ionic liquid). A suitable gap width or distance D between electrodes in the ionic liquid can be 0.1 mm to 10 mm or 0.0005 mm to 10 mm, for example at least 0.0005, 0.001, 0.002, 0.005, 0.01, 0.02, 0.05, 0.1, 0.2, 0.3, 0.4, 0.5, 0.7, 1, 1.5, 2, 3, 4, or 5 mm and/or up to 0.001, 0.002, 0.005, 0.01, 0.02, 0.05, 0.1, 0.2, 0.3, 0.6, 0.8, 1, 1.2, 1.5, 1.7, 2, 3, 4, 6, 8, or 10 mm. Alternatively or additionally, the foregoing length scales can represent a volume:surface area ratio for volume of ionic liquid medium:half of total electrode surface area.

In some embodiments, the piezoelectric apparatus 100 can be characterized by one or more relatively large length scales, in addition to its relatively small gap width or distance described above. For example, the internal volume 104 or chamber 120 can have at least one linear dimension of at least 0.01 m, which can be at least 10, 20, 50, 100, 200, 500, or 1000 and/or up to 20, 50, 100, 200, 500, 1000, 2000, 5000, or 10000 times larger than the suitable gap width or distance between the electrodes in the ionic liquid. Ionic liquid-based piezoelectric devices are easily scalable to large dimensions due to the spatial uniformity of the liquid phase in contrast to a piezoelectric solid, which is generally heterogeneous. For example, the linear dimension (e.g., length and/or width such as in a plane generally perpendicular to gap distance or compression axis/direction) can be at least 0.01, 0.02, 0.05, 0.1, 0.2, 0.5, 1, 2, 5, or 10 m and/or up to 0.02, 0.05, 0.1, 0.2, 0.5, 1, 2, 5, 10, 20, 50, or 100 m. Such dimensions generally would be impractical or impossible for solid-based piezoelectric devices. In some embodiments, the piezoelectric apparatus can be used as a sensor to detect impact or other force from collisions, explosions, etc., for example where the chamber or other walls of the apparatus are formed form a strong metal/metal alloy such as steels, hardened steels, aluminum alloys, titanium alloys, etc.

In embodiments, the piezoelectric apparatus 100 can further include an electrical device 124 in electrical connection with the first electrode 102A and the second electrode 107A. In some embodiments, the electrical device 124 can be an external voltage or power source 124A, which can be used to induce a voltage differential across the first and second electrodes 102A, 107A to induce a corresponding converse piezoelectric effect in the ionic liquid 104A. In some embodiments, the electrical device 124 can be an external electrical load 124B, such as when the generated piezoelectric effect drives/powers an external electrical device. The external electrical load 124B is not particularly limited and can generally include any electrical device being powered by the resulting voltage from the piezoelectric effect, for example in an energy harvesting, power generation, or sensing application. In addition to the external device being powered, the external load or corresponding external electrical system can further include other electrical, electronic, mechanical, etc. ancillary components, such as converters (e.g., AC-to-DC, DC-to-AC), voltage ladders (e.g., for energy harvesting), computing components (e.g., memory, processor, and/or software, etc. for controlling, monitoring, recording data from operation, etc. of the external device). Examples of such devices include electrical batteries (e.g., charged by piezoelectric power for later discharge), sensors, electrical motors (e.g., coupled to a mechanical device driven by the motor), lights, displays, wearable devices (e.g., shoes, footwear, helmet, protective or other wearable garments, such as for energy harvesting, power storage, (impact) sensing, etc.) etc.

In any of the embodiments described herein, the electrical device 124 (or one or more electrical devices 124) may be electrically connected to the piezoelectric apparatus 100 by means of electrical connections to any number of substrates, and/or internal surfaces, and/or conductive layers or films on internal surfaces of the apparatus 100. In embodiments, the voltage source 124A may be configured to apply a voltage differential across a single substrate, or a single internal surface. Alternatively, the voltage source 124A may be configured to provide voltages across multiple substrates and/or internal surfaces. Similarly, the electrical load 124B may be configured to receive induced piezoelectric voltage across a single substrate/electrode pair, or across multiple substrate/electrode pairs. In addition, the electrical device 124 may be electrically connected to the chamber 120 in a capacitive configuration, a resistive configuration, or any combination of configurations with connections to any number of substrates and/or internal surfaces. In embodiments, the electrical device 124 may be electrically connected to a substrate, an internal surface, and/or a conductive layer or film on an internal surface, at two or more locations. The electrical device 124 may be electrically connected to the chamber 120 via electrical leads, wires, connectors, etc. in contact with at least one of a substrate, an internal surface, and/or a conductive layer or film on an internal surface.

The first substrate 102 and/or second substrate 107 may be in direct contact with an ionic liquid or RTIL 104A contained within the internal volume 104. When present, a first electrically conductive layer or film 102B on the first substrate 102 may be in direct contact with the ionic liquid or RTIL 104A in the internal volume 104, and/or a second electrically conductive layer or film 107B on the second substrate 107 may be in direct contact with an ionic liquid or RTIL 104A contained within the internal volume 104. In various embodiments, the first and second layers 102B, 107B can be transparent or opaque in addition to being electrically conductive. An ionic liquid or RTIL 104A contained within the internal volume 104 may be in contact with any number of substrates, films, layers, or internal surfaces of any embodiment of a piezoelectric apparatus described herein.

In any embodiment, the first electrode 102A and the second electrode 107A independently may be a material selected from metal materials, transparent conductive metal oxides, conductive polymers, semiconducting diamonds, conductive carbons, transparent conductive carbons, and combinations thereof. Examples of metal materials include single or multiple metals or alloys such as steel. Other electrically conductive materials such as conductive polymers, carbon electrodes, etc. can be used. Examples of transparent conductive metal oxides include indium tin oxide (ITO), fluorine-doped indium tin oxide (FTO), indium zinc oxide (IZO), and aluminum zinc oxide (AZO). In any embodiment, the first and second electrode may be formed from the same or different materials, and they may either include or be formed exclusively from the foregoing specific materials or combinations thereof.

In any embodiment, the first substrate 102 and the second substrate 107 independently may be a material selected from glass, (optical grade) polymers, diamond, metals, and combinations thereof (e.g., as layered composite materials). Example optical grade polymers/plastics may include polycarbonate (PC), polystyrene (PS), and acrylics such as poly(methyl methacrylate) (PMMA). Diamond may be used as a substrate, for example a single crystal diamond or polycrystalline diamond substrate formed without any electrically (semi)conducting dopants such as boron (p-type dopant) or phosphorous (n-type dopant). In an embodiment, a non-conductive diamond substrate may be grown/synthesized (e.g., using microwave plasma assisted chemical vapor deposition, such as with a deposition source gas free from (semi)conductive dopants), and then the deposition source gas may be changed to include a p- or n-type dopant to deposit a very thin transparent, conducting diamond layer thereon. Metals, for example bulk metal materials, can be used as electrically conductive materials when the substrate or other chamber structure serves an electrode. Examples can include single or multiple metals or alloys such as steel. Similarly, other electrically conductive materials such as conductive polymers, etc. can be used as a substrate or other chamber structure. In any embodiment, first and second substrates may be formed from the same or different materials, and they may either include or be formed exclusively from the foregoing specific materials or combinations thereof.

In embodiments, the first substrate 102 and the second substrate 107 are electrically non-conductive. The substrate may be formed from non-conductive materials, such as those having an electrical conductivity of about $10^{-8}$ S/m or less. For example, glass has representative electrical conductivity values of about $10^{-11}$ S/m to $10^{-15}$ S/m, and diamond has representative values of about $10^{-11}$ S/m to $10^{-18}$ S/m. Suitable resistances for the substrates may be at least 1, 2, or 5 Ω/sq. and or up to 10, 20, or 50 Ω/sq. (e.g., sheet resistance expressed as ohms-per-square, such as determined by a four point probe technique).

In embodiments with the first and/or second layer 102B, 107A on the corresponding first and/or second substrates 102, 107, the first layer and the second layer may independently be a material selected from the group consisting of transparent conductive metal oxides, transparent conductive polymers, transparent semiconducting diamonds, transparent conductive carbons, transparent metal films, and/or combinations thereof (e.g., as blends or mixtures). The materials may be transparent in their bulk form, or they may be sufficiently thin layers to be essentially transparent as applied to their substrates (e.g., thin enough to have an optical density of 0.1 or less). The choice of material for the first and second layers may depend on the wavelengths of light of interest, desired thickness of the device, and other parameters. Potential transparent conductive metal oxides for forming the first and/or second layer or film may include indium tin oxide (ITO; or tin-doped indium oxide), fluorine-doped indium tin oxide (FTO), indium zinc oxide (IZO), aluminum zinc oxide (AZO). Potential transparent semiconducting conductive polymers for forming the first and/or second layer or film include polyacetylenes, polyphenylene vinylenes, polypyrroles, polythiophenes, polyanilines, and polyphenylene sulfides. Potential transparent semiconducting diamonds for forming the first and/or second layer or film include boron-doped diamond (p-type dopant) or phosphorous-doped diamond (n-type dopant). Potential transparent conductive carbons for forming the first and/or second layer or film include graphene films and carbon nanotube films that are thin enough to be transparent. Potential transparent metal films for forming the first and/or second layer or film include any evaporated metal film thin enough to be transparent. In other embodiments with reflective substrates, layer, films, and/or internal surfaces, may use metal films (e.g., silver) or other materials that are conductive but non-transparent (e.g., due to their thickness or otherwise) as an opaque or reflective layer. The first and second layers or films may be formed from the same or different materials, and the first and second layers or films may either include or be formed exclusively from the foregoing specific materials or combinations thereof.

In embodiments with the first and/or second layer 102B, 107A on the corresponding first and/or second substrates 102, 107, the first layer and the second layer may independently have an electrical conductivity of about $10^4$ S/m or more (e.g., about $10^4$ S/m, $10^5$ S/m, or $10^6$ S/m or more and/or up to about $10^6$S/m, $10^7$S/m, or $10^8$S/m). For example, electrical conductivity values of about $10^5$-$10^6$ S/m are representative for various transparent conducting metal oxides and values of about $10^5$ S/m are representative for graphite. In some embodiments, materials with relatively lower electrical conductivity values may be used, in particular with relatively low thickness values (e.g., thus increasing the fraction of surface atoms/molecules, even if at a relatively lower current values).

In embodiments with the first and/or second layer 102B, 107A on the corresponding first and/or second substrates 102, 107, the first layer and second layer may independently have a thickness of 10 µm or less (e.g., 10, 5, 2, 1, 0.5, 0.2, 0.1, 0.05, 0.02, 0.01 µm or less and/or 0.3, 0.5, 1, 2, 5, 10, 20, 50, 100, 200, 500, or 1000 nm or more.) Conductive thin films are suitable. The lower limit of a monolayer of material (e.g., being a single atom, molecule, lattice unit, monomer unit, etc. thick) would have only external surface conduction. Bilayers or other multilayers of a material only several atomic, molecular, lattice, or monomer layers (e.g., 2-10) thick would similarly be suitable for increasing the relative fraction of external surface conduction. In embodiments with transmissive substrates and/or internal surfaces, the first transparent layer and the second transparent layer may independently have an optical transmittance of at least 80% (e.g., at least 80, 85, 90, or 95% and/or up to 90, 95, 98, 99, or 100%).

Figure 2:
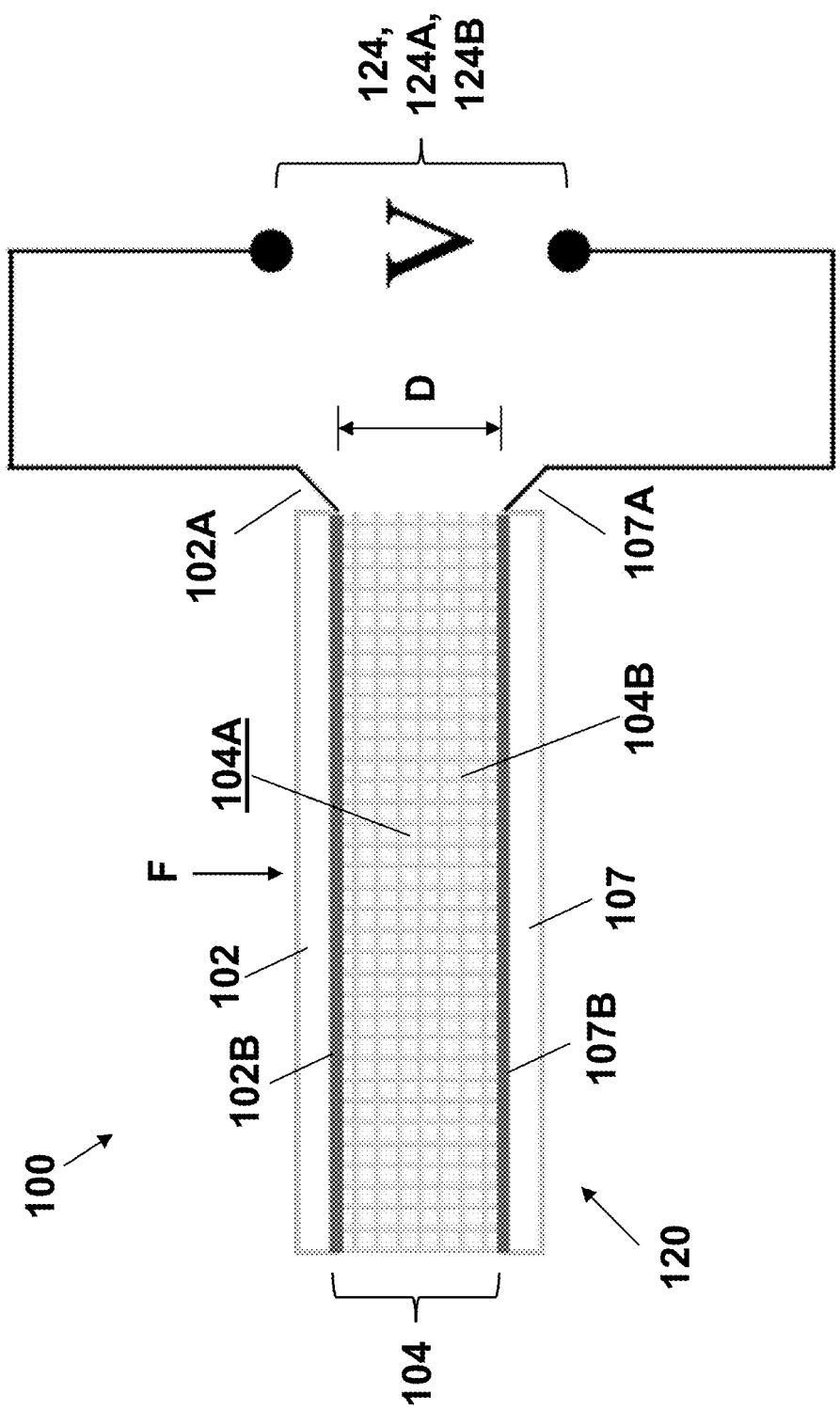
FIG. 2 illustrates a piezoelectric apparatus according to the disclosure in a particular embodiment having a compressible or flexible solid substrate in the internal volume of the apparatus.

FIG. 2 illustrates a piezoelectric apparatus 100 according to the disclosure in a particular embodiment having a compressible or flexible solid substrate 104B in the internal volume 104 of the apparatus 100. The substrate 104B can be foamed or flexible porous sponge material with the ionic liquid 104A generally filling the pores or other open volume(s) of the solid substrate 104B, thereby creating a compressible internal volume 104, for example combining the effects of an incompressible ionic liquid and compressible solid substrate. The ionic liquid 104A and solid substrate 104B collectively provides a controlled/dampened piezoelectric relaxation response upon application of an applied compressive force F. In the illustrated embodiment, the first surface 102 includes an inner-facing, electrically conductive first layer 102B, which serves as the first electrode 102A surface in contact with the RTIL 104A. Similarly, the second surface 107 includes an inner-facing, electrically conductive second layer 107B, which serves as the second electrode 107A surface in contact with the RTIL 104A. In other embodiments (not shown), other electrode structures 102A, 107A and/or conducting substrates 102, 107 can be used.

Figure 3:
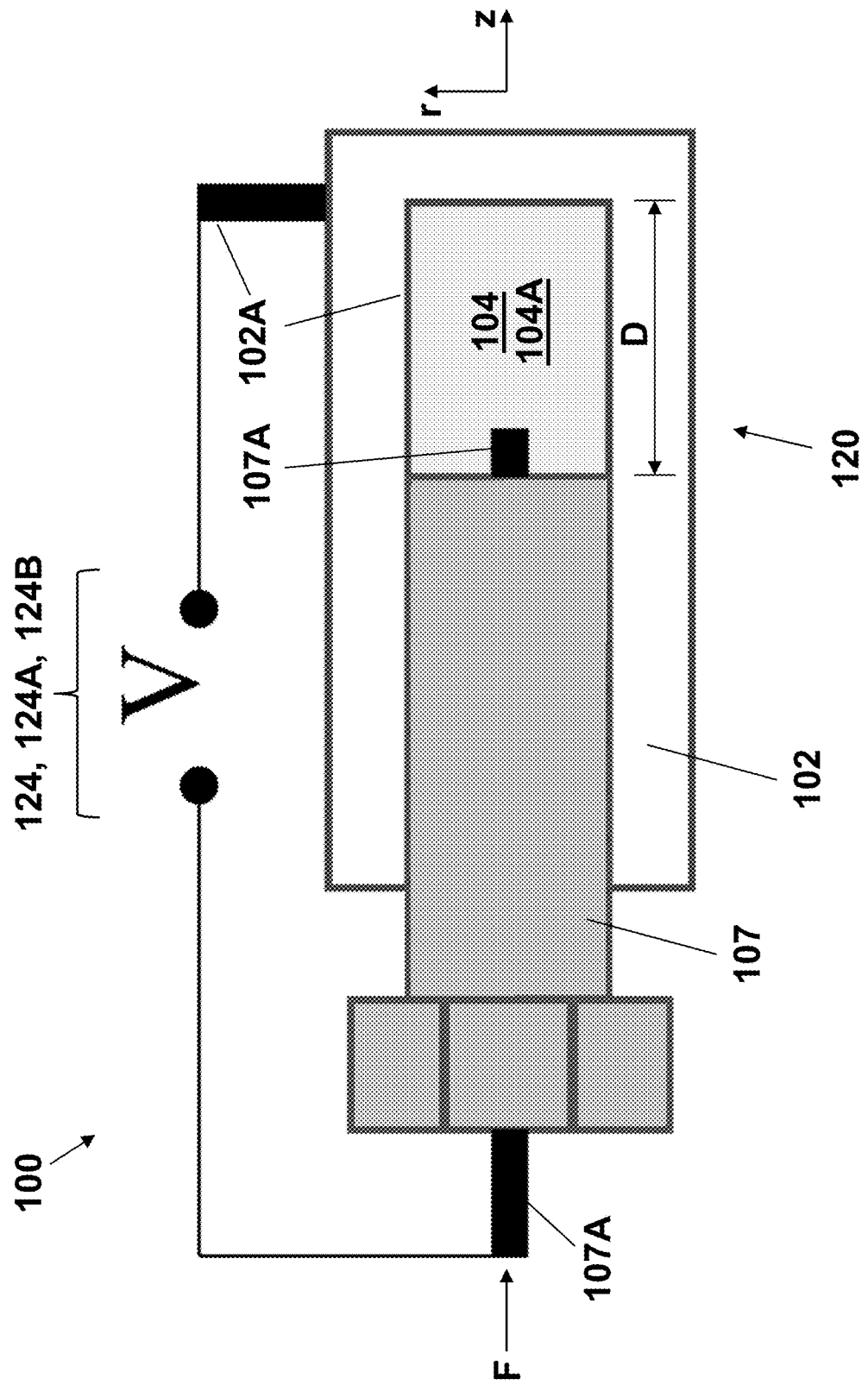
FIG. 3 illustrates a piezoelectric apparatus according to the disclosure in a particular embodiment having a slidable (cylindrical) piston as part of the chamber defining the internal volume of the apparatus.
Figure 4:
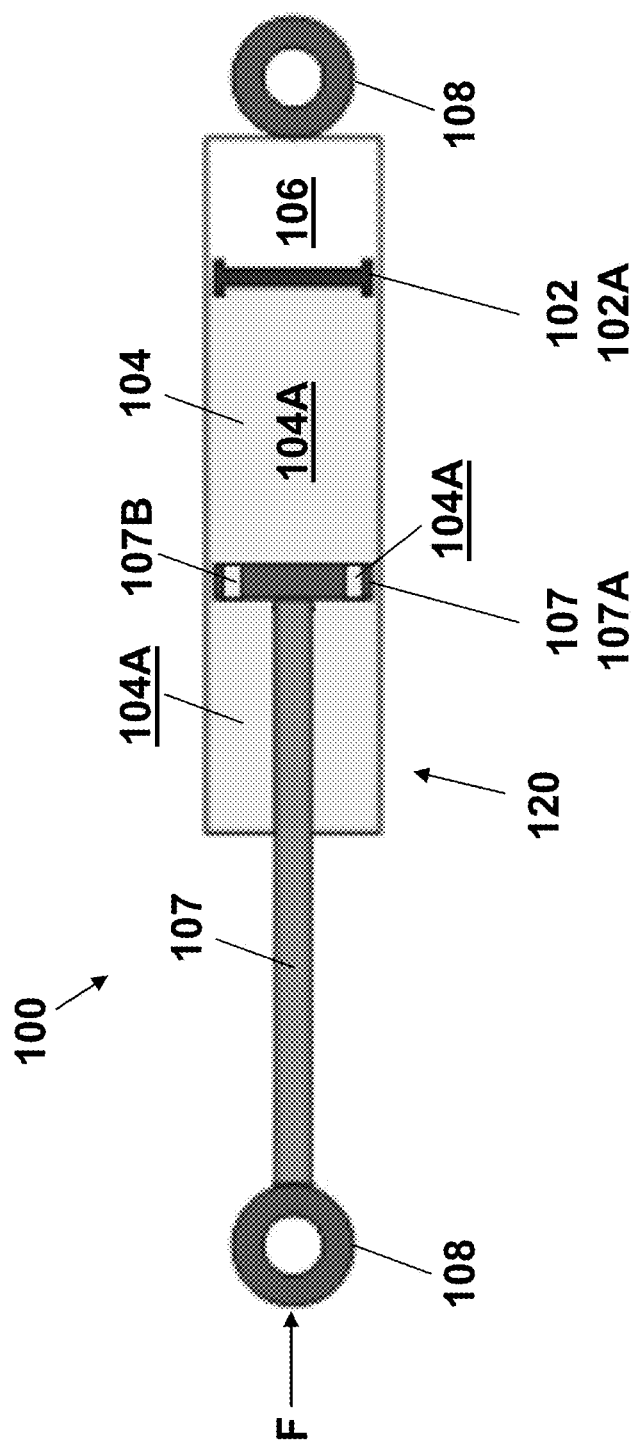
FIG. 4 illustrates a piezoelectric apparatus according to the disclosure in a particular embodiment of a piezoelectric shock absorber.

FIG. 3 illustrates a piezoelectric apparatus 100 according to the disclosure in a particular embodiment having at least one deformable or translatable wall for its chamber 120. The deformable or translatable wall can include one or more of a flexible solid material as a wall, a slidable/translatable piston structure in a tube/conduit, etc. As particularly illustrated, the piezoelectric apparatus 100 includes a body (or first surface) 102 of the chamber that is made of an electrically conductive material serving as a first electrode 102A at the interface with the RTIL 104A. Alternatively, the body (or first surface) 102 can be a non-conducting material with a conductive layer 102B thereon (not shown). The piston (or second surface) 107 is an electrically insulating, non-conductive material that further include a center electrode structure (e.g., steel or other metal) as a second electrode 107A. The axially slidable (e.g., cylindrical) piston is part of the chamber 120 defining the internal volume 104 of the apparatus 100. The structure in FIG. 3 can be used for piezoelectric apparatus 100 designed to exhibit either the direct or converse piezoelectric effect. For example, an electrical load 124B connected to the apparatus 100 can be driven by the direct piezoelectric effect when a compressive force F is applied to the piston 107 (e.g., a piezoelectric shock absorber). Similarly, an electrical voltage source 124A connected to the apparatus 100 can induce controlled axial translation of the piston when voltage is applied to the electrodes 102A, 107A (e.g., a piezohydraulic apparatus). FIG. 4 illustrates a particular embodiment of the piezoelectric apparatus 100 including a translatable wall for use as a piezoelectric shock absorber. The apparatus 100 includes a chamber 120 with a floating piston (or first surface) 102 serving as a first electrode 102A (e.g., with an electrically conductive floating piston or an electrically conductive coating thereon). The main piston (or second surface) 107 is axially slidable and serves as a second electrode 107A (e.g., with an electrically conductive main piston or an electrically conductive coating thereon). An RTIL 104A is contained in the internal volume 104, and the main piston 107 includes gaps or slots 107B through which the RTIL 104A can move between areas on opposite sides of the main piston 107, for example when a compressive force F (or shock to be absorbed) is exerted on the main piston 107 to translate it axially. This compressive force F is also exerted on the floating piston 102; some of the force F is absorbed/dampened by compression of a gas 106 in a reservoir opposing the internal volume 104 (i.e., on the opposing side of the floating piston 102), and some of the force F is exerted on the RTIL 104A to exhibit the direct piezoelectric effect between the electrodes 102A, 107A (e.g., and also drive a connected electrical load 124B, not shown). Suitable mechanical or mounting fasteners 108 can be used to mount the piezoelectric shock absorber in any desired setting (e.g., in a vehicle or otherwise).

In an embodiment, the piezoelectric apparatus 100 includes an external electrical load 124B in electrical connection with the first electrode 102A and the second electrode 107A. The chamber can include one or more flexible wall segments, for example deformable or translatable wall segments, which define a deformable internal volume in the chamber based on external applied force. In some embodiments, first electrode 102A and the second electrode 107A are not in electrical connection with an external voltage or power source 124A. This can represent an embodiment in which electrodes attached to the cell are connected to an external electrical load driven by piezoelectric voltage upon application of force to the cell (e.g., in an energy harvesting, power generation, or sensing application).

In a more particular embodiment, the chamber 120 of the piezoelectric apparatus 100 can include at least one deformable or translatable wall, such as a flexible solid material as a wall, a slidable/translatable piston structure in a tube/conduit, etc., so that the chamber 120 and internal volume 104 deform or contract when force is applied to the ionic liquid 104. This can represent an embodiment in which a piezoelectric apparatus has a piston-like structure, for example as a component of or replacement for a shock absorber in a transportation vehicle (car, truck, etc.) in which the apparatus provides both shock absorption and piezoelectric energy generation from each compression when driving. The electrical load can be the electrical system of the vehicle and/or a battery, such that the piezoelectric apparatus and associated electrical circuitry provides conversion of mechanical energy to electrical energy or electrical energy storage.

In an embodiment, the piezoelectric apparatus 100 includes an external voltage source 124A in electrical connection with the first electrode 102A and the second electrode 107A, such as where the voltage source is adapted to apply a voltage differential between electrodes and induce an electrical current through the ionic liquid, thereby inducing the converse piezoelectric effect. The chamber 120 of the piezoelectric apparatus 100 can further include at least one deformable or translatable wall, such as a flexible solid material as a wall, a slidable/translatable piston structure in a tube/conduit, etc. so that the chamber and internal volume deforms/expands when voltage is applied to the ionic liquid. This can represent an embodiment in which electrodes attached to the cell are connected to an external electrical power source that induces ionic liquid deformation via the converse piezoelectric effect upon application of a voltage to the ionic liquid from the power source (e.g., in a piezo-pneumatic device for hydraulics, sensing, or actuation).

Figure 5:
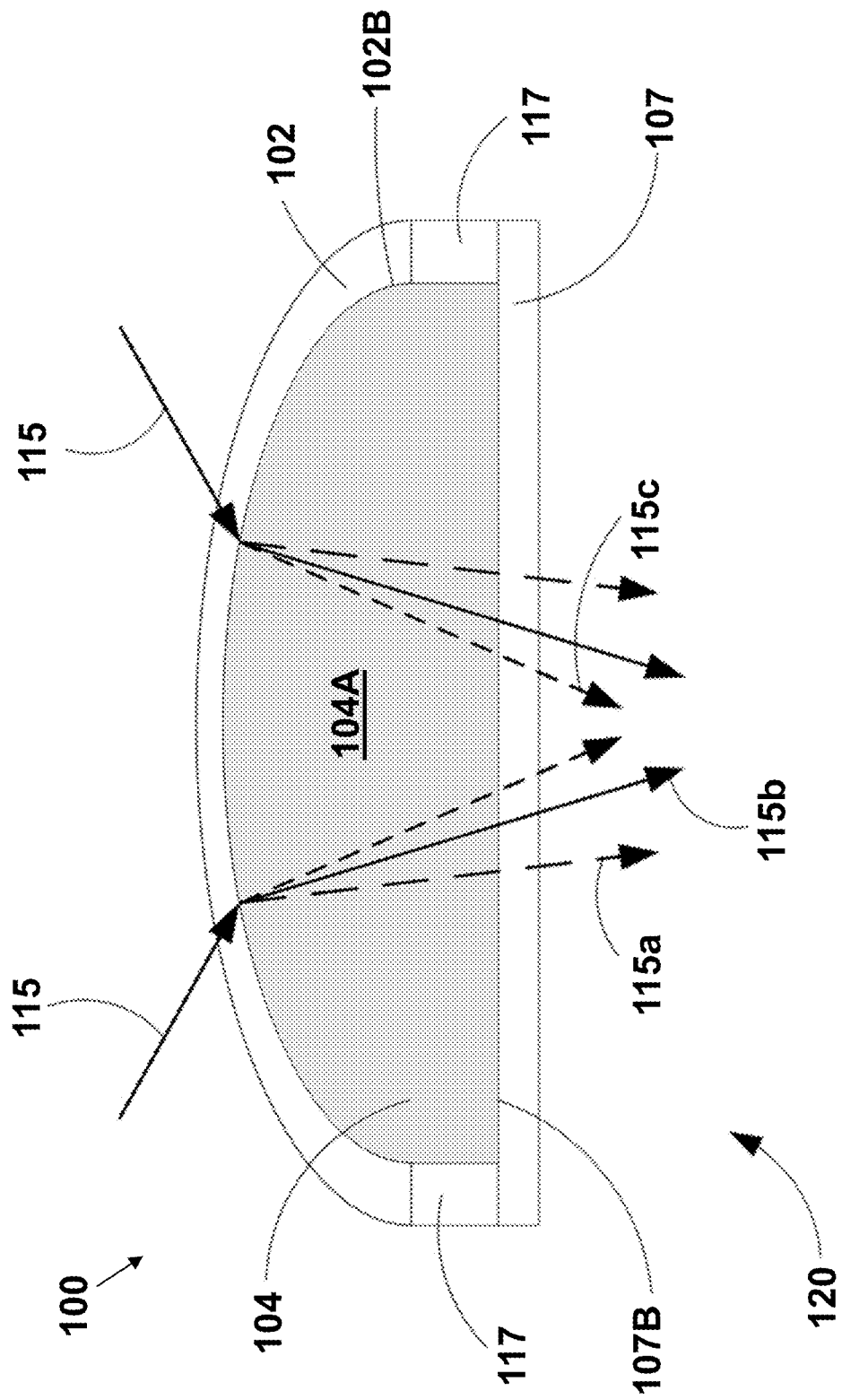
FIG. 5 illustrates a piezoelectric apparatus according to the disclosure in a particular embodiment having optically transparent walls.

In an embodiment, the chamber 120 includes at least one (or at least two) opposing, optically transparent surfaces. This can include two opposing transparent walls or one transparent and one opaque/reflective opposing walls. The at least one transparent wall can provide optical access from a point external to the piezoelectric apparatus into the internal volume and ionic liquid, and/or provide an optical path through the transparent surfaces and through the ionic liquid. This can represent an embodiment in which the chamber has optically transparent walls such that an applied force induces a piezoelectric effect, or an applied voltage induces a converse piezoelectric effect confined to the chamber that changes the optical properties of the ionic liquid in the cell (e.g., in various optical sensors, light modulators, or mechanical modulators). FIG. 5 illustrates a piezoelectric apparatus 100 with transparent walls or surfaces 102, 107 having corresponding electrically conductive layers 102B, 107B in an embodiment with a non-planar (e.g., concave or convex) structure as illustrated for the first surface 102. This can form an optical lens, for example where incident light 115 entering the apparatus 100 can exit the apparatus 100 at different angles (e.g., illustrated as refracted light 115a, 115b, or 115c for different angles) depending on the index of refraction of the RTIL 104A, which index of refraction can be controlled or adjusted by application of voltage (e.g., via a voltage source 124A and suitable electrical/electrode connections, not shown), for example with at least one of the surfaces 102, 107 being deformable and/or translatable.

Figure 6:
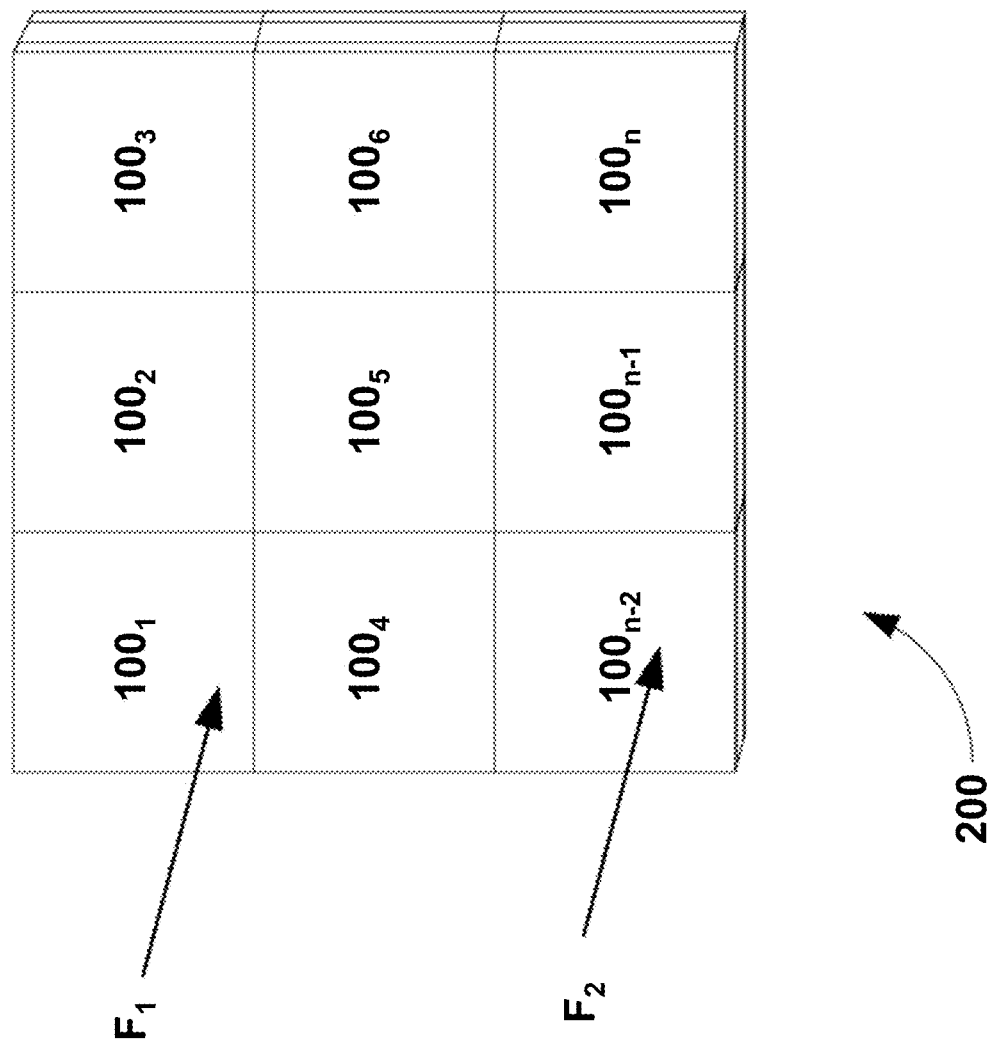
FIG. 6 illustrates a multiplexed piezoelectric apparatus according to the disclosure.

FIG. 6 illustrates a multiplexed piezoelectric apparatus 200 according to the disclosure. The multiplexed apparatus 200 includes a plurality of individual piezoelectric apparatus 100 (e.g., illustrated as $100_1$, $100_2$, ... $100_n$ for n individual apparatus 100). The electrodes (not shown) of the individual piezoelectric apparatus 100 can have any suitable electrical connection to each other and/or to the electrical device 124 (not shown in FIG. 6), for example including a serial connection between the individual piezoelectric apparatus 100, separate, parallel connections between each individual piezoelectric apparatus 100 and the electrical device 124, etc.

In an embodiment of the multiplexed apparatus 200, the chamber 120 of each piezoelectric apparatus 100 is separate from the other chambers, such as where the internal volumes and ionic liquids therein are separate/segregated from each other, or otherwise not in fluid contact or fluid communication with each other, in a known/selected spatial pattern such that an applied force and corresponding piezoelectric effect voltage can be correlated to a known location, for example in a spatially specific sensing application. This can represent an embodiment in which a piezoelectric apparatus can be a component of or replacement for a touch screen or other spatially specific pressure-sensing device, for example being able to distinguish between two applied forces $F_1$ and $F_2$ at different locations of the multiplexed apparatus 200. In a touch screen application, the individual chambers/internal volume can be quite small to provide high spatial resolution and sensitivity, for example having representative dimensions of about 0.01 mm (width)×0.01 mm (length)×0.001 mm (height or gap distance). The length and width can represent any suitable (orthogonal) chamber length scales in a plane generally perpendicular to gap distance or compression axis/direction for the apparatus. Suitable values and ranges for gap distance are described above. The width and length dimensions independent can be at least 0.005, 0.01, 0.02, 0.05, or 0.1 mm and/or up to 0.01, 0.02, 0.05, 0.1, 0.2, or 0.3 mm. Alternatively or additionally, surface areas of opposing walls in the individual chambers (e.g., which can be coated with (transparent) conductive materials as opposing electrodes) can be at least 0.2, 0.5, 1, 2, 5, 10, 20, or $50 \times 10^{-4}$ mm$^2$ and/or up to 1, 2, 5, 10, 20, 50, or $100 \times 10^{-4}$ mm$^2$.

In another embodiment of the multiplexed apparatus 200, the chamber 120 of each piezoelectric apparatus 100 is separate from the other chambers, such as where the internal volumes and ionic liquids therein are separate/segregated from each other or otherwise not in fluid contact or fluid communication with each other, but in an arrangement where the chambers can be (electrically) connected either in series or in parallel, such as serial and/or parallel electrical connections between first and/or second electrodes of the different piezoelectric apparatus. The piezoelectric effect voltage or current can be additive with these configurations and function as an energy storage apparatus.

In some embodiments, at least one of the first electrode 102A and the second electrode 107A (e.g., both electrodes) is chemically modified to control the long range (e.g., micrometers or longer) molecular organization of the piezoelectric ionic liquid 104A in contact with the at least one of the first and second electrode 102A, 107A. For example, the first and second electrodes 102A, 107A can be chemically modified with a chiral or otherwise optically active chemical modifier. Chemical modifiers can include organic or inorganic compounds containing terminal oxygen, nitrogen, sulfur, phosphorus or carbon functionality, alone or in combination with other functionalities. The same or different materials or chemical modifiers can be selected for the first and second electrodes. Introduction of such chemical modification onto the electrodes can be used enforce macroscopic ionic liquid ordering, which in turn allows control/selection of the polarity of the apparatus (i.e., which electrode is positive and which electrode is negative).

Figure 14:
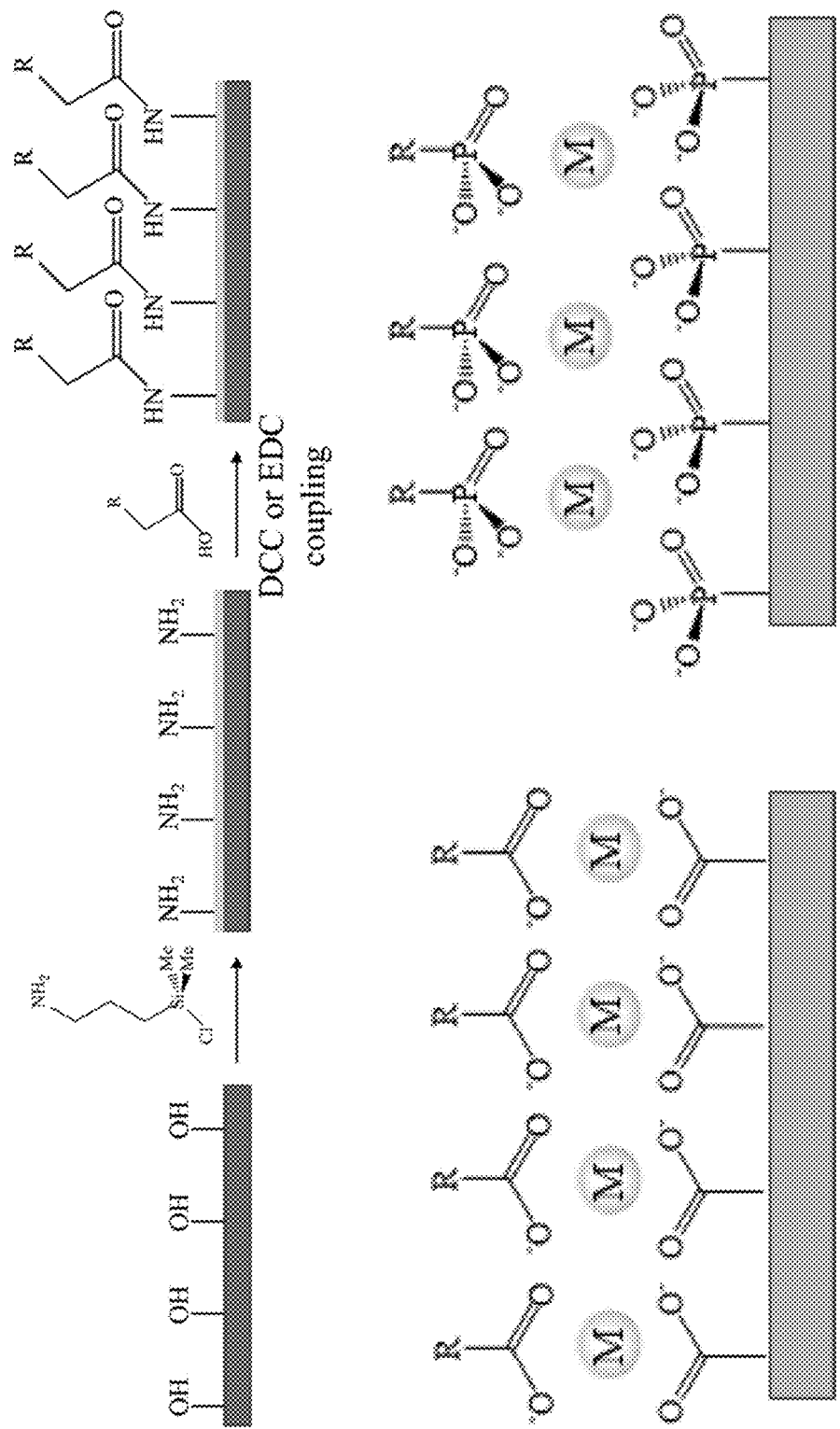
FIG. 14 illustrates covalent (top) and ionic (bottom) surface modifications that can be used to control molecular organization of an ionic liquid in a piezoelectric apparatus according to the disclosure.

FIG. 14 illustrates two means of imposing organization in RTILs within the chamber of the piezoelectric apparatus 100. The first is through covalent bonding of specific functionalities to the support surface that will interact with an RTIL overlayer to function as nucleation sites for the inducement of order (FIG. 14, top). The second is to provide ionic surface functionalities to control the interface properties electrochemically to modify the structure of the interface (i.e., Faradaic control; FIG. 14, bottom). Both approaches require the chemical modification of the support surface, for example the first substrate 102 and/or the second substrate 107.

Figure 15:
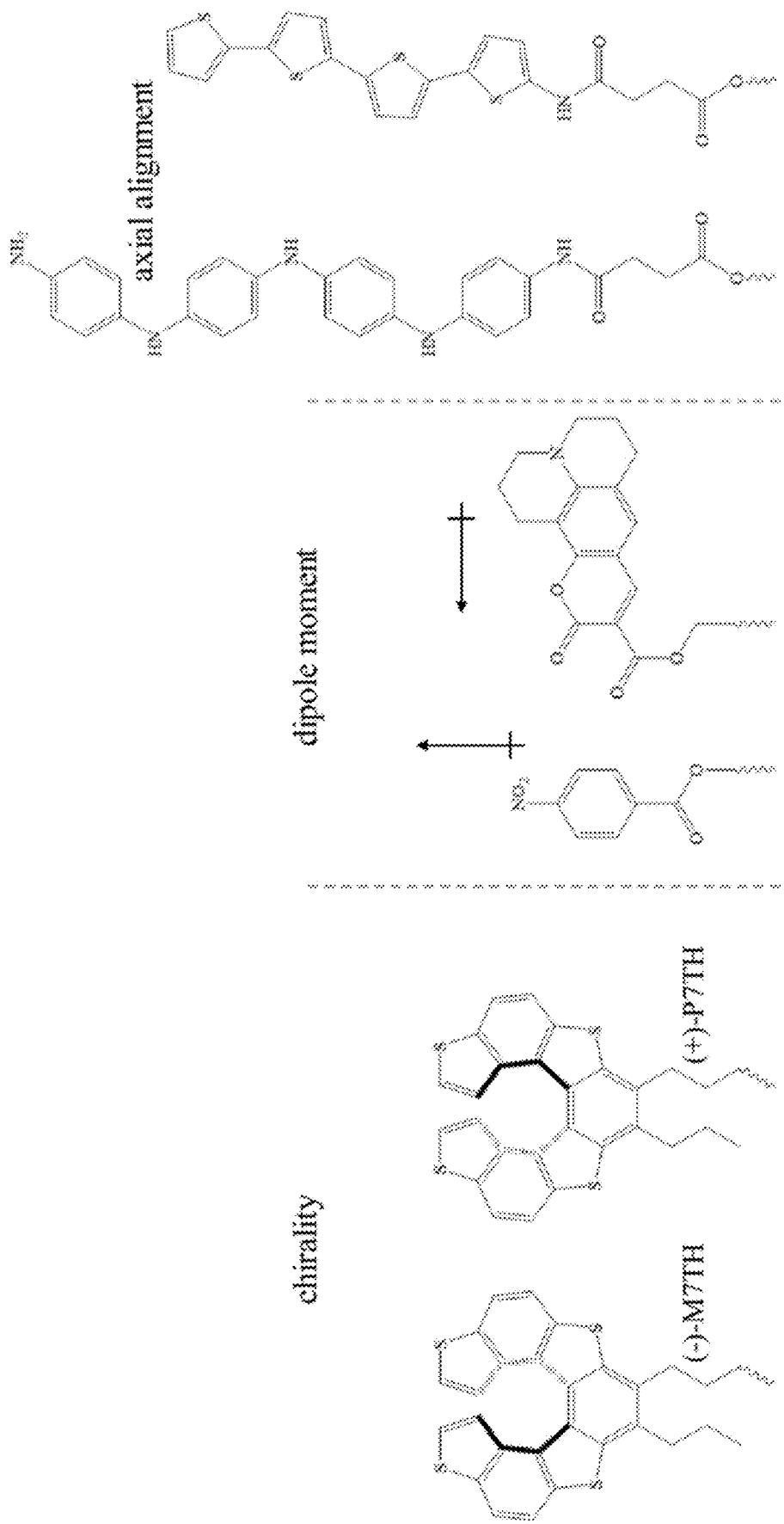
FIG. 15 illustrates pendant surface-modifying groups that can be used to control molecular organization of an ionic liquid in a piezoelectric apparatus according to the disclosure, including representative groups to control surface chirality (left), dipole moment orientation (middle), and axial alignment (right).

Covalent control of support surface structure. The strategy alters the surface in contact with the RTIL with chemical functionality that will interact strongly with RTIL constituents and produce an ordered initial layer on the support surface. The first step in surface modification is to change the ambient surface functionality to one that is reactive under mild conditions for the deposition of the surface modification agents. Several mild reactions are appropriate for coupling surface-bound amines to carboxylic acids with high efficiency. These facile reactions allow for subsequent modification of the modified surface with a wide variety of chemical functionalities (i.e., R groups in FIG. 14, top right), with a goal of inducing mesoscopic organization in an RTIL overlayer. There are three approaches to achieving templated organization. These are to use surface-bound functionality R that will interact with an RTIL overlayer by means of chiral interactions, dipolar interactions. or by axial alignment (FIG. 15). The goal of introducing chirality at the interface is to control piezoelectric behavior of the RTIL by mediating its charge density gradient. The goal of using dipole moment-induced orientation in RTILs is to control piezoelectric behavior of the RTIL through the orientation of Bjerrum pairs. The goal of using axial alignment is to control piezoelectric behavior of the RTIL by introducing orientational organization in the RTIL primarily through dispersion interactions with the aliphatic chains of the cationic RTIL component. Examples of suitable chemical functionalities for surface modification include polar molecules characterized by a large Stokes shift (dipolar control), bio-oligomers such as amino acids or carbohydrates (chiral control), and rigid oligomers such as polydiacetylenes, polyanilines, and polythiophenes (axial alignment).

Faradaic control of support surface structure. In addition to templating based on covalent surface modification, interfaces can be modified using metal ion complexation chemistry (FIG. 14, bottom). The primary difference between the two methods is that the charge state of metal ions can be switched by Faradaic means (i.e., electron transfer) between different oxidation states and such a change will alter the bonding configuration of the surface modifiers (i.e., the top RCOO$^-$ and RPO$_3^{-2}$ layers in FIG. 14, bottom) to control the identity and/or accessibility of the interface. If grown on a conducting support (ITO or FTO), the metal ion can undergo electron transfer with the support to change its oxidation state reversibly, depending on the metal ion. Such a change of metal ion oxidation state has two effects: a change in the net charge of the interface (providing control over charge density gradient) and a change in the details of how the metal ions bond with functionalities above and beneath it. The induced interface rearrangement will exert control over interface-induced organization in the RTIL. Faradaic control over interface organization can be used in concert with the same structural variables described above for covalent modification (e.g., chirality, dipole moment, or axial alignment groups). The difference between the two systems is the ability to control surface organization in situ (Faradaic control), which is not possible with covalent surface modification. Suitable metals (M in FIG. 14) for Faradaic control can include Cu, V, Ru, Ni, Fe, and their corresponding cations.

Ionic Liquid

Ionic liquids (ILs), sometimes referenced as room-temperature ionic liquids (RTILs), are salts that exist in a liquid state at room temperature conditions. While most common liquids such as water are generally electrically neutral, ionic liquids have a high concentration of ions and are therefore electrically charged. Due to the high charge densities of ionic liquids, they can be useful in a number of applications including battery technologies, dispersing agents, solar thermal energy, supercapacitor technologies, fuel processing, pharmaceuticals, and electro-optics, among others. One property of interest of ionic liquids for the disclosed optical devices is the ability of the ionic liquids to either (or both of) the piezoelectric effect or the converse (or inverse) piezoelectric effect, depending on whether a mechanical force of voltage, respectively, is applied to the ionic liquid.

Figure 7:
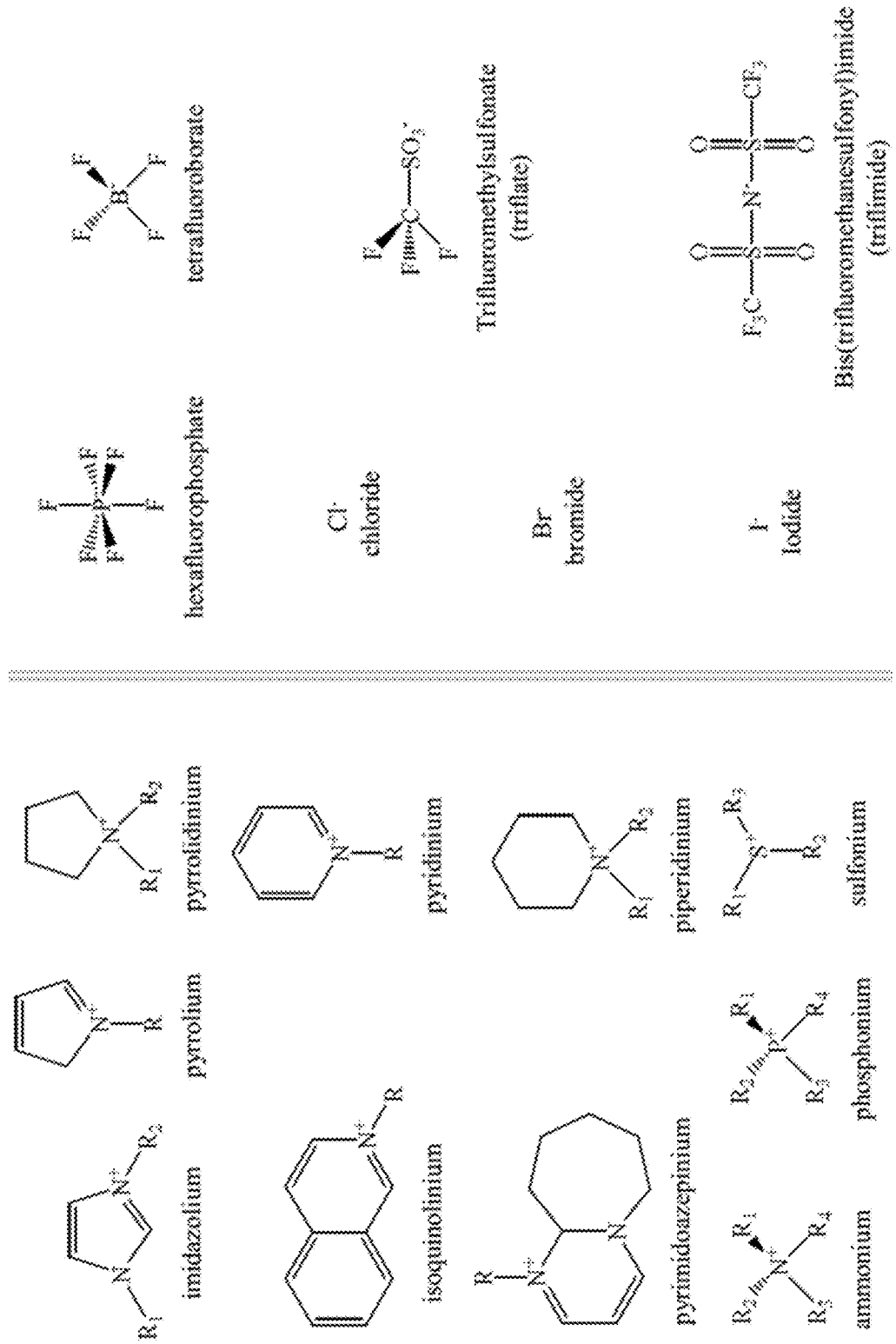
FIG. 7 illustrates chemical structures for representative components of ionic liquids, including cationic moieties (left) and anionic moieties (right).
Figure 8:
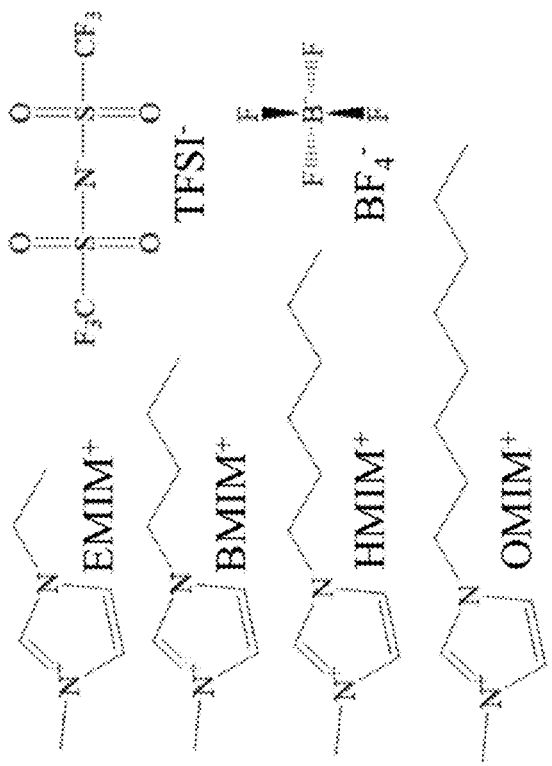
FIG. 8 illustrates chemical structures and properties for representative ionic liquids (mp=melting point, $T_g$=glass transition temperature, p=density, V=volume of cation or anion).

Ionic liquids are generally known in the art and typically include a cationic moiety and an anionic moiety (or counter anion). Ionic liquids are typically colorless. FIG. 7 and FIG. 8 illustrate structures and properties of some common ionic liquids, including their respective cationic groups, anionic groups, and physical properties.

Representative cationic moieties or groups can include substituted or unsubstituted pyridinium, pyridazinium, pyrimidinium, pyrazinium, oxazinium, thiazinium, imidazolium, pyrazolium, thiazolium, isothiazolium, oxazolium, isoxazolium, and triazolium cationic moieties. The cationic moiety (or ionic liquid more generally) can include one or more organic substituents such as alkyl groups and aryl groups. Organic substituents can be pendant groups from the cationic moiety, in particular a pendant group from one or more ring carbon atoms or ring (positively charged) nitrogen atoms replacing a hydrogen atom. In some embodiments, substituents on a cationic moiety can be present on one or more N, P, or S atoms in the cationic moiety. Each organic substituent independently may be linear or branched alkyl of 1 to 20 carbon atoms (e.g., substituted or unsubstituted), aryl of 5 to 20 carbon atoms (e.g., substituted or unsubstituted). For example, an alkyl group can be a linear, branched, or cyclic, substituted or unsubstituted group with 1-20, 2-10, or 3-6 carbon atoms, such as containing at least 1, 2, 3, 4, or 6 carbon atoms and/or up to 4, 6, 8, 10, 12, 16, or 20 carbon atoms. Similarly, an aryl group can be a substituted or unsubstituted group with 5-20, 6-15, or 6-10 carbon atoms, such as containing at least 5, 6, 8, 10, or 12 carbon atoms and/or up to 10, 12, 15, or 20 carbon atoms. As illustrated in FIG. 7, the illustrated R, $R_1$, $R_2$, $R_3$, and $R_4$ groups can be hydrogen or any of the foregoing organic substituents.

Representative anionic moieties or counter anions can include sulfate, hydrogen sulfate, nitrate, fluoride, chloride, bromide, iodide, methyl sulfonate (e.g., alkyl or aryl sulfonate more generally), cyanide, cyanate, thiocyanate, bis(trifluoromethanesulfonyl)imide (triflimide), fluoroborate anions (e.g., tetrafluoroborate, or haloborate anions more generally), fluorophosphate anions (e.g., hexafluorophosphate, or halophosphate anions more generally), and trifluoromethyl sulfonate (triflate). More generally the counter anion can include an alkyl- and/or aryl-substituted anion, such as a substituted sulfonate, sulfonyl, borate, phosphate, etc. anion. Suitable organic substituents for the anionic moiety can be selected from the same options described above for the cationic moiety organic substituents. For example, an alkyl group can be a linear, branched, or cyclic, substituted or unsubstituted group with 1-20, 2-10, or 3-6 carbon atoms, such as containing at least 1, 2, 3, 4, or 6 carbon atoms and/or up to 4, 6, 8, 10, 12, 16, or 20 carbon atoms. Similarly, an aryl group can be a substituted or unsubstituted group with 5-20, 6-15, or 6-10 carbon atoms, such as containing at least 5, 6, 8, 10, or 12 carbon atoms and/or up to 10, 12, 15, or 20 carbon atoms.

More generally, the anionic moiety or counter anion can contain (i) one or more boron (B), nitrogen (N), phosphorous (P), or sulfur (S) atoms, (ii) one or more halogen atoms (e.g., fluorine (F)), (iii) optionally one or more carbon (C) atoms, and (iv) optionally one or more oxygen (O) atoms. For example, the anionic moiety can include 1, 2, 3, 4, 5, or 6 of B, N, P, and/or S atoms. Further, the anionic moiety can include 1-20, 2-12, or 3-6 carbon atoms, such as in (per) halo- or (per)fluorocarbon groups. Further, the anionic moiety can include 1-20, 2-12, or 3-6 oxygen atoms, for example bound to the B, N, P, or S atoms.

The piezoelectric property for a given ionic liquid can be characterized by its piezoelectric constant ($d_{33}$). The $d_{33}$ piezoelectric constant generally relates to deformation in the same direction (polarization axis) as the induced potential. The $d_{33}$ piezoelectric constant can be measured as described in the examples below, for example by measuring potential V(F) in suitable cell after exceeding a threshold force (F) that induces the piezoelectric effect at a specified input impedance of $10^{12}\Omega$. In embodiments, the ionic liquid exhibits a piezoelectric constant ($d_{33}$) of at least 0.01 pC/N, or in a range of 0.01-30, 0.02-20, 0.1-10, 0.2-5, or 0.3-3 pC/N, such as at least 0.01, 0.02, 0.05, 0.1, 0.2, 0.3, 0.5, 0.7, 1, 1.5, 2, or 3 and/or up to 0.2, 0.4, 0.6, 0.8, 1, 1.3, 1.7, 2, 3, 5, 7, 10, 20, or 30 pC/N. Other piezoelectric constants such as $d_{31}$ (response when the force is applied perpendicular to the polarization axis) and $d_{15}$ (response when the applied mechanical stress is due to shear deformation) are generally not applicable to ionic liquids and/or much smaller in magnitude that the $d_{33}$ piezoelectric constant. The piezoelectric property for a given ionic liquid can be characterized by its force threshold (or minimum force at which it exhibits the direct or converse piezoelectric effect), which can be determined as described in the examples below. In some embodiments, the force threshold can be up to (or not more than) 40, 80, 120, 160, or 200 N and/or at least 0.01, 0.1, 1, 2, 5, or 10 N. In some embodiments, the force threshold at least 100, 150, 200, or 300 N and/or up to 150, 250, 350, or 500 N.

In some embodiments, the ionic liquid, or a single liquid phase containing one or more ionic liquids, completely fills the internal volume, for example where the ionic liquids represent at least 95, 98, 99 wt. % and/or up to 100 wt. % of the material in the internal volume. In other embodiments, the internal volume can contain other materials that are not ionic liquids, such as a dispersed or discrete solid material (e.g., a flexible sponge or other medium to retain the ionic liquid), a dissolved solid material, another liquid (i.e., not an ionic liquid) mixed with or dispersed in the ionic liquid, etc. In such case, the ionic liquids represent at least 10, 20, 30, 40, 50, 60, or 70 wt. % and/or up to 40, 60, 80, 90, 95, 98, or 99 wt. % of the material in the internal volume. Alternatively or additionally, the internal volume can be substantially free from a headspace, for example having substantially no (continuous) gaseous phase or void volume above (e.g., relative to gravity) the ionic liquid phase, although the internal volume can include encased/enclosed discrete gaseous regions such as in foamed/porous solid substrate in the internal volume. For example, the internal volume is suitably free from additional fluid (e.g., gas or liquid) phases in the internal cell volume that are immiscible with the ionic liquid, for example an immiscible liquid, a separate gas phase (headspace), etc.

EXAMPLES

The following examples illustrate the disclosed apparatus and methods, but are not intended to limit the scope of any claims thereto. In the following examples, ionic liquids are incorporated into a piezoelectric apparatus, which is then evaluated for its ability to exhibit a piezoelectric effect.

Example 1

This example illustrates the direct piezoelectric effect in room-temperature ionic liquids (RTILs). The RTILs 1-butyl-3-methyl imidazolium bis(trifluoromethyl-sulfonyl)imide (BMIM+TFSI−) and 1-hexyl-3-methyl imidazolium bis(trifluoromethylsulfonyl) imide (HMIM+TFSI−) produce an electrical potential upon the application of force when confined in the internal volume of a cell as a piezoelectric apparatus, with the magnitude of the potential being directly proportional to the force applied.

Materials: Room-temperature ionic liquids 1-butyl-3-methyl imidazolium bis (trifluoromethylsulfonyl) imide (BMIM$^+$TFSI$^-$, >99%, <500 ppm H$_2$O) and 1-hexyl-3-methyl imidazolium bis(trifluoromethylsulfonyl)imide (HMIM$^+$TFSI$^-$, 98%) were purchased from Sigma-Aldrich and were then purified prior to use according to a procedure reported previously. Following purification, the water content of the RTILs was measured by Karl Fischer (Mettler-Toledo C10S) titration and found to be less than 50 ppm. Ethylene glycol and sodium chloride (Sigma-Aldrich) were used as received.

Piezoelectric Apparatus: The piezoelectric apparatus 100 used in this example is illustrated in FIG. 3. The apparatus 100 includes a cell or chamber 120 containing an RTIL 104A in the internal volume 104 of the cell. The body (or first surface) 102 of the cell is made of steel, which is an electrically conductive material serving as a first electrode 102A at the interface with the RTIL 104A. The piston (or second surface) 107 is made of DELRIN (an electrically insulating, non-conductive material) and is equipped with a steel center electrode as a second electrode 107A. The DELRIN piston contains an O-ring (VITON; not shown) to ensure a tight seal upon contacting the RTIL. The seal is liquid-tight but not air-tight, such that air can escape until the piston contacts the RTIL. The dimensions of the piston are 1.2 cm in diameter and, with the O-ring, 1.4 cm in diameter, which is the same as the inside diameter of the cylinder. The bottom of the O-ring is 2.5 mm above the bottom of the piston. For the 200 μL sample size used for all measurements, the thickness T of the RTIL confined in the cylinder is 0.64 mm. The force-induced charge is measured as an open circuit potential difference between the cell body and the piston center electrode (i.e., between the first and second electrodes 102A, 107A) as a function of force F applied to the piston. The force applied is measured with a digital force gauge (VETUS 500N). In this configuration, the force and potential difference are along the same axis (e.g., an axial direction aligned with/defined by the second electrode 107A as illustrated).

Open Circuit Potential Measurements: Open circuit potential measurements were performed by using an electrochemical bench (CH Instruments 604B) as illustrated in FIG. 3 as an electrical device 124 (such as a voltage sensor 124B). For these measurements, the input impedance is about $10^{12} \Omega$ with a small stray capacitance contribution that can be seen in the control (blank) measurements.

Figure 9:
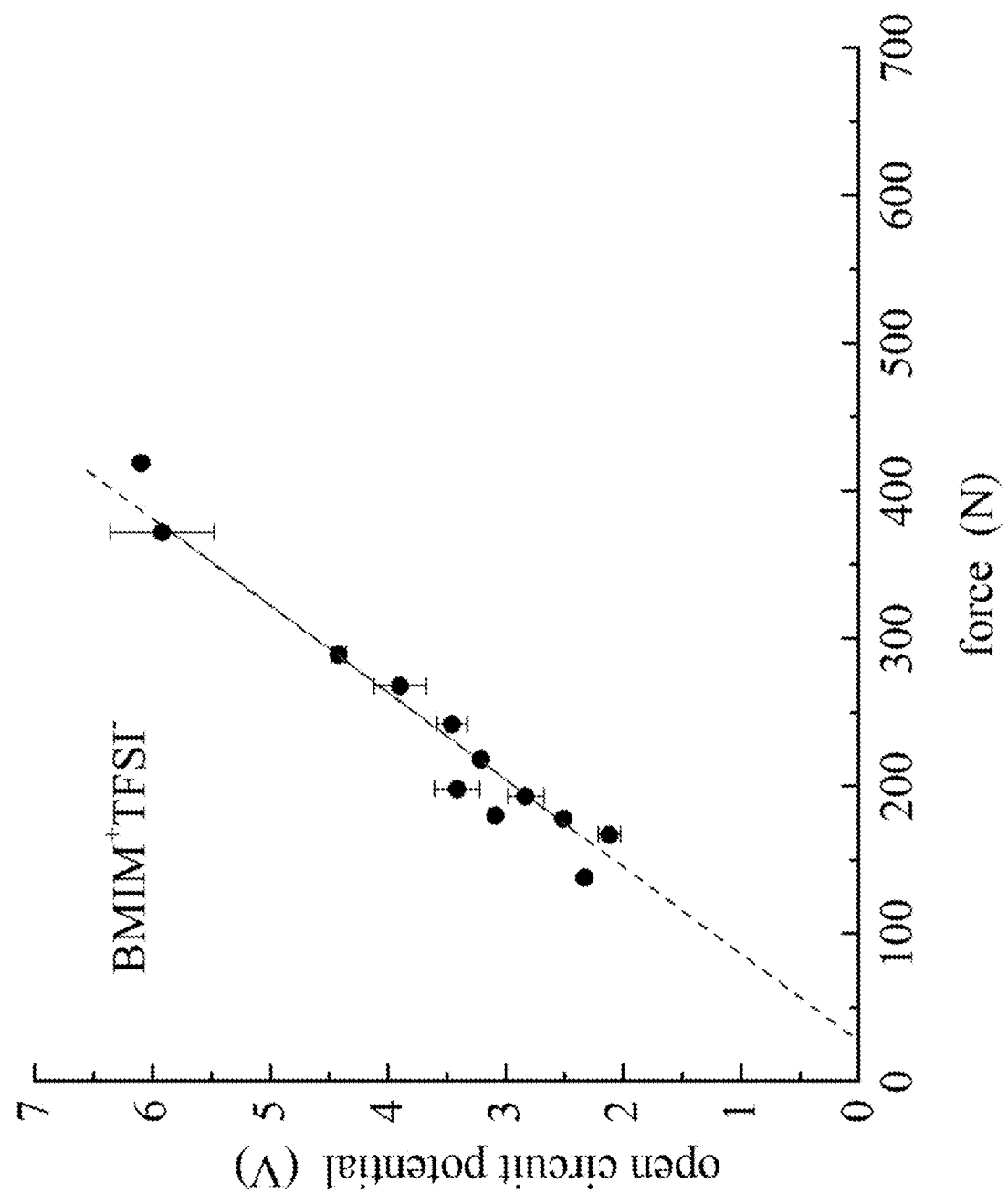
FIG. 9 is a graph showing potential measured vs force applied for $BMIM^+TFSI^-$ in Example 1 for multiple time scans. The slope of the dependence is about 17±1 mV/N, and the x-intercept is about 27 N.
Figure 10:
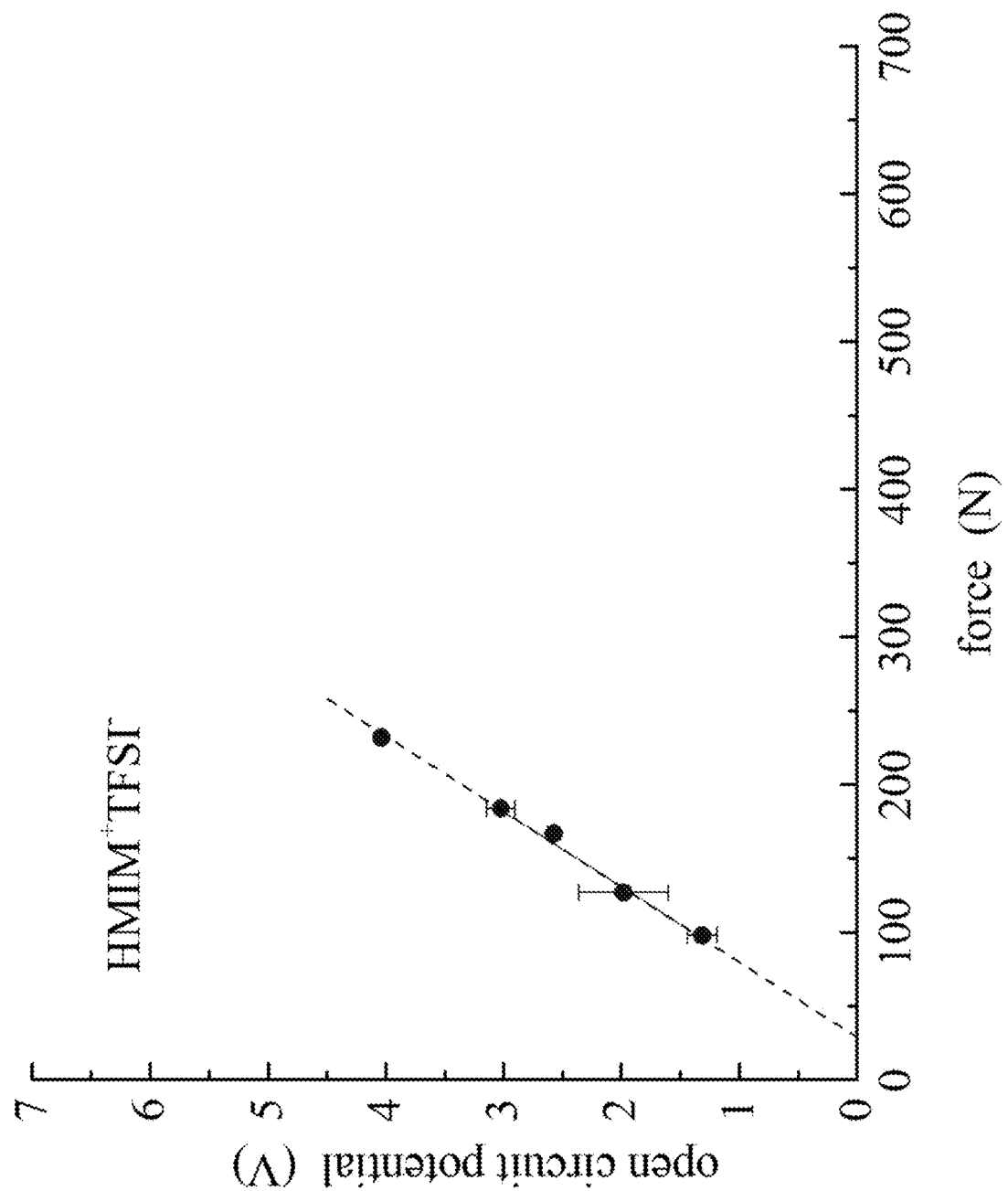
FIG. 10 is a graph showing potential measured vs force applied for $HMIM^+TFSI^-$ in Example 1 for multiple time scans. The slope of the dependence is about 20±1 mV/N, and the x-intercept is about 29 N.

The direct piezoelectric effect in neat RTILs was measured and is shown as potential vs. force data for BMIM$^+$TFSI$^-$ (FIG. 9) and for HMIM$^+$TFSI$^-$ (FIG. 10). The dependence of the open circuit potential on the force shows a linear dependence over the range studied for both RTILs. The data are reproducible over multiple experiments. The functional form of the data, i.e., the shape of the potential pulse resulting from the application of force, is determined by the mechanical relaxation of the cylinder/piston apparatus and does not reflect an intrinsic relaxation effect in the RTILs. Control experiments were performed in which the cell was filled with either neat ethylene glycol or 1 M NaCl in ethylene glycol, both in the absence of force and with the application of force in the same manner as that for the RTILs. The open circuit potential is 350 mV or less in all cases, and the magnitude of the control experiment data (not shown) is a factor of about 20 smaller than the potential maxima for the RTILs, and there is no measurable piezoelectric response for either the neat molecular liquid or a 1 M NaCl solution.

The magnitude of the direct piezoelectric effect in the RTILs measured in this example is about 17±1 mV/N (slope) and about 27 N (x-intercept or force threshold) for BMIM$^+$TFSI$^-$ and about 20±1 mV/N (slope) and about 29 N (x-intercept or force threshold) for HMIM$^+$TFSI$^-$, as determined from the slopes of the best-fit lines shown in FIG. 9 and FIG. 10. Based on the geometry of the cell and the volume of RTIL used (200 μL), these slopes correspond to piezoelectric constants, $d_{33}$, of 0.36±0.04 pC/N and 0.42±0.03 pC/N assuming a dielectric constant of ε of about 10 for both RTILs. The magnitude of the measured piezoelectric constants for the RTILs are within a factor of 10 of quartz ($d_{33}$=−2.3 pC/N).

This example demonstrates the direct piezoelectric effect in a bulk liquid-phase material, specifically room-temperature ionic liquids BMIM$^+$TFSI$^-$ and HMIM$^+$TFSI$^-$. The magnitude of the direct piezoelectric effects in these materials is an order of magnitude smaller than that of quartz, a widely used piezoelectric material. The existence of the direct piezoelectric effect in RTILs implies organization being induced in these media that lifts the bulk center of symmetry that is characteristic of most liquid-phase media. The presence of the piezoelectric effect in a neat liquid permits applications that have previously not been accessible with solid-state materials, and RTILs are more readily recyclable and in many instances pose fewer environmental issues than many currently used piezoelectric materials.

Example 2

Following the general procedure of Example 1, this example illustrates the direct piezoelectric effect in RTILs with pyrrolidinium and imidazolium cations, and tetrafluoroborate and bis(trifluoromethylsulfonyl) imide anions. All the RTILs evaluated exhibit the direct piezoelectric effect, with a magnitude ($d_{33}$) and force threshold that depends on the structures of the cation and anion. The structure-dependence and the existence of a force threshold for the piezoelectric effect is consistent with a pressure-induced liquid-to-crystalline solid phase transition in the RTILs and this is confirmed experimentally through X-ray diffraction data.

Materials: The following ionic liquids were used in this example, but other ionic liquids as generally described above could be used as well. The imidazolium ionic liquids 1-butyl-3-methyl imidazolium bis(trifluoromethylsulfonyl) imide (BMIM$^+$TFSI$^-$, >99%, <500 ppm H$_2$O, Sigma-Aldrich), 1-hexyl-3-methyl imidazolium bis(trifluoromethylsulfonyl)imide (HMIM$^+$TFSI$^-$, 98%, Sigma-Aldrich), 1-octyl-3-methyl imidazolium bis(trifluoromethylsulfonyl) imide (OMIM$^+$TFSI$^-$, 98%, Sigma-Aldrich), 1-butyl-3-methyl imidazolium tetrafluoroborate (BMIM$^+$BF4$^-$, ≥98%, Sigma-Aldrich) and 1-octyl-3-methyl imidazolium tetrafluoroborate (OMIM$^+$BF4$^-$, >97%, Sigma-Aldrich) were purified before use according to published methods. The pyrrolidinium ionic liquids 1-butyl-3-methylpyrrolidinium bis(trifluoromethylsulfonyl)imide (BMPyrr$^+$TFSI$^-$), 1-hexyl-3-methylpyrrolidinium bis(trifluoromethylsulfonyl) imide (HMPyrr$^+$TFSI$^-$), 1-octyl-3-methylpyrrolidinium bis (trifluoromethylsulfonyl)imide (OMPyrr$^+$TFSI$^-$) and 1-decyl-3-methylpyrrolidinium bis(trifluoromethylsulfonyl) imide (DMPyrr$^+$TFSI$^-$) were synthesized according to published methods. The chiral ionic liquid 1-citronellol-3-methylimidazolium bis(trifluoromethylsulfonyl)imide (CitMIM$^+$TFSI$^-$) synthesized according to published methods. After purification and prior to use, the water content of all RTILs used here was determined by Karl Fischer titration (Mettler-Toledo C10S) to be less than 50 ppm.

Piezoelectric Apparatus and Measurements: The piezoelectric apparatus 100 FIG. 3 used in Example 1 was also used in Example 2. Piezoelectric measurements were similarly performed as in Example 1.

High Pressure X-ray Diffraction (XRD) Measurements. XRD experiments under pressure were carried out using a Rigaku XTALLAB SYNERGY-S, DUALFLEX, HYPIX single crystal X-ray diffractometer with Mo Kα radiation (micro-focus sealed X-ray tube, 50 kV, 1 mA, λ=0.71073 Å). The ionic liquid samples were loaded inside a Diacell Bragg (S) Plus diamond anvil cell (DAC) manufactured by Almax-easyLab with 600-μm culet-size. The 250 μm thick steel gasket was pre-indented to about 100 μm prior to sample loading. A 210 μm hole was then drilled in the center using an electronic discharge machine drilling system. Notably, no pressure-transmitting medium was employed, given the liquid state nature of the samples. The pressure was determined and monitored by the R1 fluorescence line of ruby. Data acquisition was executed with a 30-second exposure time per frame. To ensure reproducibility, three distinct scans were performed for each RTIL. The obtained diffraction data underwent comprehensive analysis using CRYSALISPRO software. The resultant data facilitated indexing of the structure pertaining to the high-pressure phase, a process conducted utilizing GSAS-II.

Results: The magnitude of the direct piezoelectric effect was evaluated in several RTILs, with imidazolium cations that have $C_8$ alkyl and citronellyl functionalities, pyrrolidinium cations with $C_4$, $C_6$, $C_8$ and $C_{10}$ alkyl functionalities, and the results were compared with the piezoelectric response of imidazolium RTILs with $BF_4^-$ and $TFSI^-$ anions. It was found that the magnitude of the direct piezoelectric effect depends on both cation and anion structure, and, that the potential vs. force relationship for all RTILs is characterized by a structure-dependent force threshold.

The potential vs. force data for the RTILs tested were fit using linear regression to evaluate both the piezoelectric magnitude ($d_{33}$; determined from slope) and the force threshold (x-intercept from fit) for each RTIL. The results are summarized in Table 1 below, in which N is the number of data points, slope is the potential/force in units of mV/N, threshold force (X-int) is in units of N, and the piezoelectric magnitude $d_{33}$ is in units of pC/N. The quantity $d_{33}$ was calculated from the slope, as described in Example 1 above. Representative potential vs. force graphs for the RTILs of Example 2 are included in FIG. 11 ($OMIM^+TFSI^-$) and FIG. 12 ($CitMIM^+TFSI^-$).

TABLE 1

RTIL Potential vs. Force Data Fits

| RTIL | N | Slope (mV/N) | Std. Error | Y-int (mV) | Std. Error | X-int (N) | Std. Error | $d_{33}$ (pC/N) | Std. Error |
|---|---|---|---|---|---|---|---|---|---|
| $BMIM^+TFSI^-$ | 12 | 16.9 | 1.7 | −457 | 424 | 27 | 25 | 0.36 | 0.04 |
| $HMIM^+TFSI^-$ | 5 | 19.7 | 1.2 | −574 | 167 | 29 | 9 | 0.42 | 0.03 |
| $OMIM^+TFSI^-$ | 11 | 17.2 | 2.5 | −1964 | 641 | 115 | 41 | 0.37 | 0.05 |
| $CitMIM^+TFSI^-$ | 31 | 5.2 | 0.8 | −1807 | 386 | 349 | 75 | 0.11 | 0.02 |
| $BMIM^+BF_4^-$ | 18 | 2.3 | 0.3 | −171 | 80 | 75 | 36 | 0.05 | 0.01 |
| $OMIM^+BF_4^-$ | 19 | 2.8 | 0.6 | −816 | 325 | 289 | 131 | 0.06 | 0.01 |
| $BMPyrr^+TFSI^-$ | 20 | 2.1 | 0.2 | −824 | 79 | 391 | 47 | 0.05 | 0.01 |
| $HMPyrr^+TFSI^-$ | 20 | 2.5 | 0.2 | −652 | 76 | 260 | 35 | 0.05 | 0.01 |
| $OMPyrr^+TFSI^-$ | 29 | 4.8 | 0.7 | −1510 | 344 | 313 | 83 | 0.10 | 0.02 |
| $DMPyrr^+TFSI^-$ | 24 | 2.7 | 0.6 | −970 | 334 | 366 | 151 | 0.06 | 0.01 |

To evaluate the dependence of $d_{33}$ on cation aliphatic chain length, open circuit potential vs. applied force was measured for BMIM$^+$TFSI$^-$ (C$_4$), HMIM$^+$TFSI$^-$ (C$_6$) and OMIM$^+$TFSI$^-$ (C$_8$). The results indicate that all three RTILs have the same $d_{33}$ to within the experimental uncertainty (Table 1 and FIG. 11 for OMIM$^+$TFSI$^-$). Significantly, the addition of an unsaturation and a stereocenter to the imidazolium aliphatic chain has a large effect on $d_{33}$ (FIG. 12 for CitMIM$^+$TFSI$^-$). Despite the chirality intrinsic to the CitMIM$^+$TFSI$^-$ cation, the value of $d_{33}$ is smaller than for the 1-alkyl-3-methylimidazolium RTILs.

To evaluate the role of the cation polar headgroup, the potential vs. force relationships were determined for 1-alkyl-1-methylpyrrolidone RTILs for BMPyrr$^+$TFSI$^-$ (C$_4$), HMPyrr$^+$TFSI$^-$ (C$_6$), OMPyrr$^+$TFSI$^-$ (C$_8$) and DMPyrr$^+$TFSI$^-$ (C$_{10}$). As was the case for the imidazolium cations, the aliphatic chain length does not appear to have an influence on $d_{33}$ for the pyrrolidinium RTILs (Table 1). When comparing the results for the imidazolium and pyrrolidinium RTILs, however, the imidazolium RTILs possess a $d_{33}$ value about six times larger than the pyrrolidinium RTILs (Table 1).

The piezoelectric coefficient also depends on RTIL anion identity. Comparing BMIM$^+$TFSI$^-$ and OMIM$^+$TFSI$^-$ to BMIM$^+$BF$_4^-$ and OMIM$^+$BF$_4^-$, the BF$_4^-$ RTILs are characterized by $d_{33}$ values a factor of about 6 smaller than the TFSI$^-$ RTILs. Note the cation aliphatic chain independence for both TFSI$^-$ and BF$_4^-$ RTILs. The $d_{33}$ values reported for the imidazolium BF$_4^-$ RTILs are essentially the same as those for the pyrrolidinium TFSI$^-$ RTILs (Table 1).

Taken collectively, the $d_{33}$ data for the RTILs examined demonstrate several trends. The first is that the piezoelectric response is nominally independent of cation alkyl chain length, but does depend on the structure of the aliphatic chain (CitMIM$^+$TFSI$^-$). This result is somewhat surprising because a requirement for the piezoelectric effect to be operative, at least in a solid, is that there is no center of inversion in the medium. The use of a chiral constituent would ensure the absence of a center of inversion, at least for a solid state material, which may be present upon the application of force. The piezoelectric response does depend on the identity of the cationic polar headgroup and the anion, although information from these data alone is not sufficient to infer any details about local organization.

Figure 11:
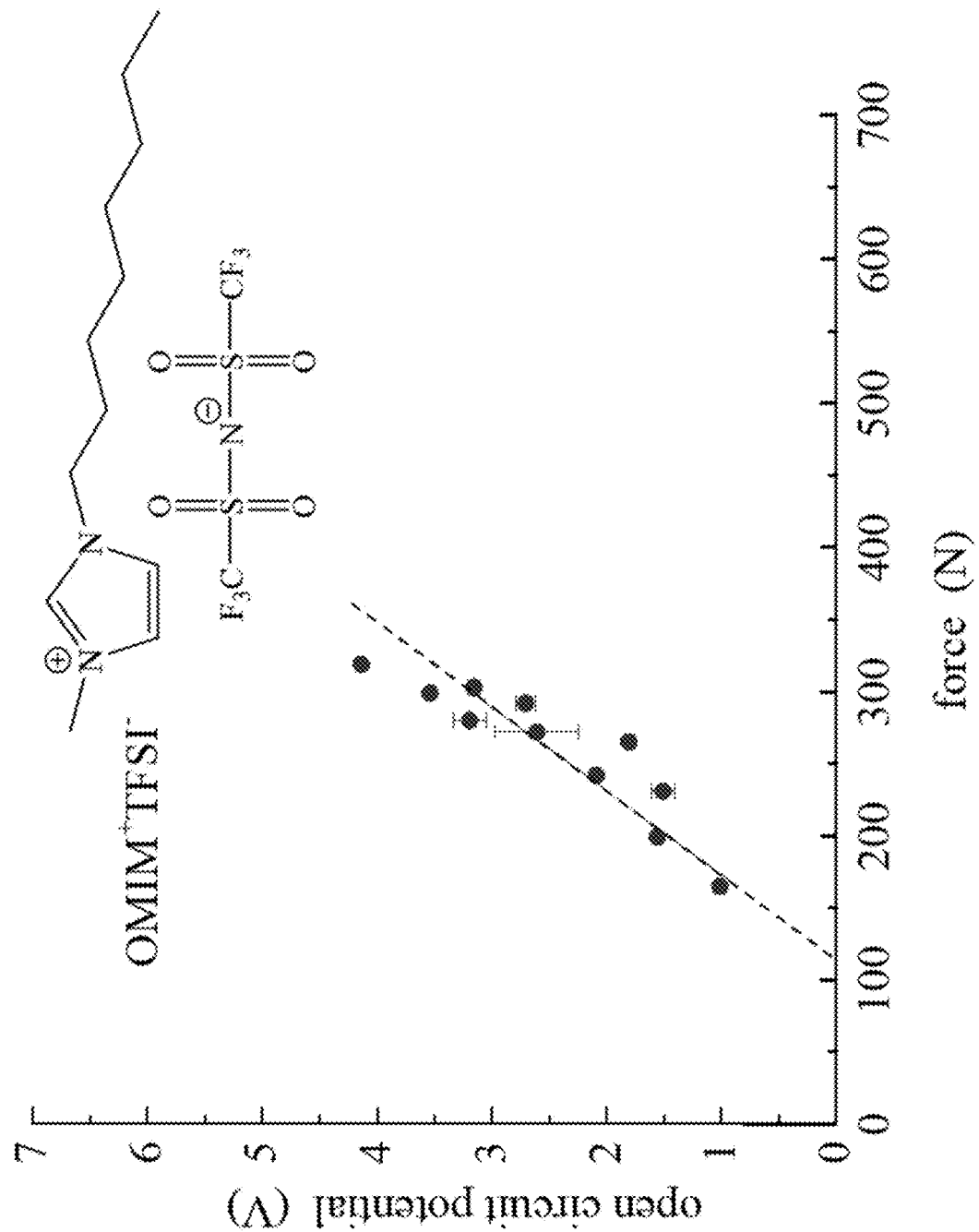
FIG. 11 is a graph showing potential measured vs force applied for $OMIM^+TFSI^-$ in Example 2 for multiple time scans. The slope of the dependence is about 17 mV/N, and the x-intercept is about 115 N.
Figure 12:
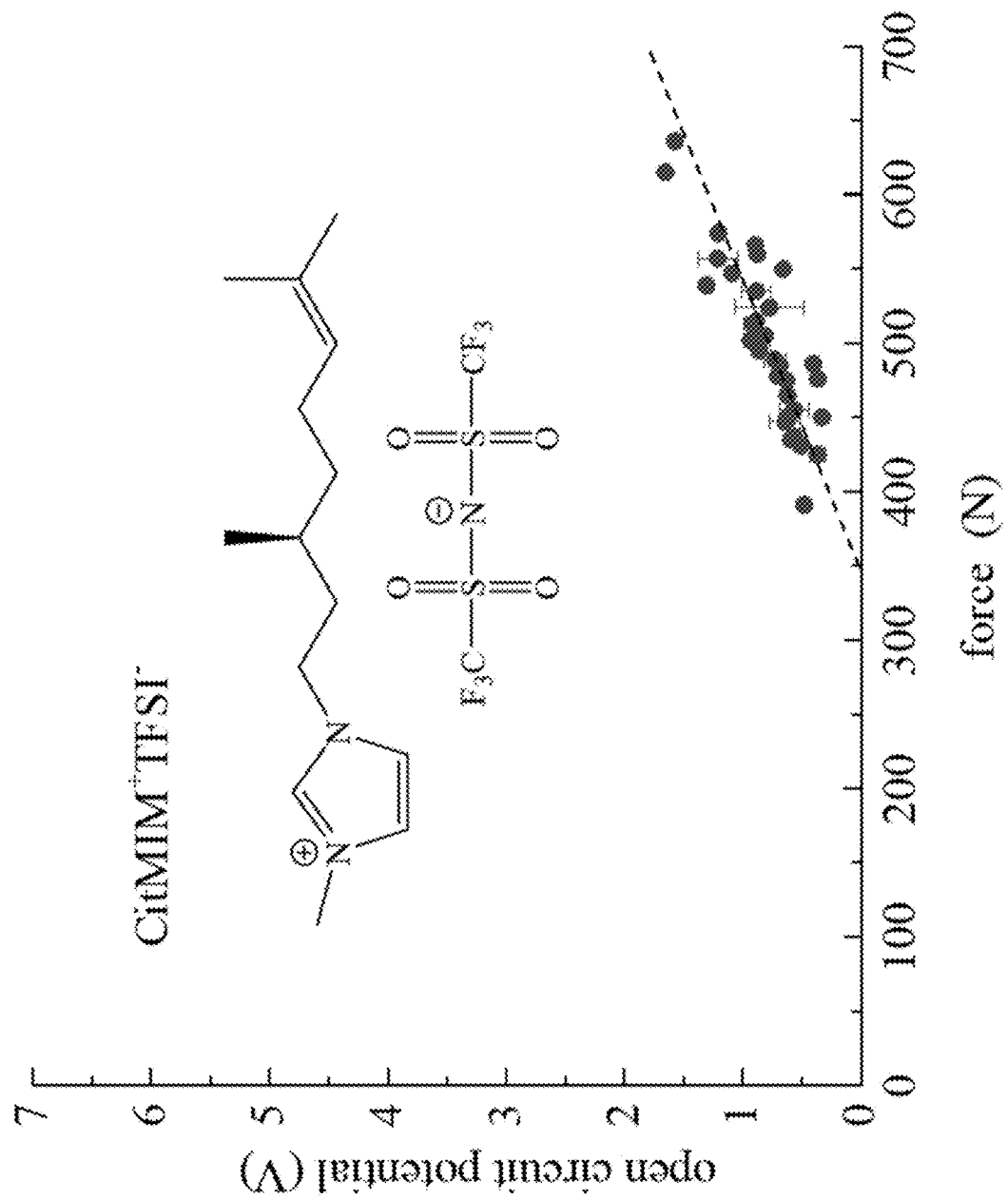
FIG. 12 is a graph showing potential measured vs force applied for $CitMIM^+TFSI^-$ in Example 2 for multiple time scans. The slope of the dependence is about 5 mV/N, and the x-intercept is about 349 N.

As illustrated in FIG. 11, FIG. 12, and Table 1, regression of the potential vs. force data for each RTIL demonstrates that there is a threshold force required for the piezoelectric response. The threshold force is seen to depend on RTIL cation and anion structure (Table 1). The presence of this feature in the data is important because it provides a means of reconciling the piezoelectric effect in RTILs with the piezoelectric effect in solid state materials.

The RTILs HMIM$^+$TFSI$^-$, HMPyrr$^+$TFSI$^-$ and CitMIM$^+$TFSI$^-$ were analyzed by XRD. There are a number of peaks in the XRD data (not shown), including those associated with the RTILs, the diamond, the ruby, and the steel gasket. The fact that there are discrete peaks associated with the RTILs demonstrates that the RTILs have undergone a liquid-to-crystalline solid phase transition. It is the crystalline solid RTIL that is responsible for the direct piezoelectric effect.

The XRD data showing discrete peaks that are assigned to the RTILs can be indexed to obtain lattice parameters. These parameters are shown in Table 2, which includes the best two indexing results for the RTIL unit cells. Based on fitting parameters alone, it is not possible to distinguish between the two possibilities. However, when these fitted results are examined in the context of other data, it is possible to gain some additional insight. Table 3 shows the hydrodynamic volumes and maximum RTIL cation length for the systems examined by XRD. The hydrodynamic volumes were calculated according to the method of van der Waals increments, and the maximum length of the RTIL cations were calculated using molecular mechanics. The hydrodynamic volume calculations may not be in exact agreement with other methods of estimating molecular volume, but this method has proven to be useful and accurate when applied to solution phase molecular motion measurements. The maximum lengths of the RTIL cations are calculated assuming all-trans aliphatic chains. These data, when viewed in the context of the fitted unit cell volumes allow the elimination of some possible fits and for the estimation of the number of molecules in the unit cell. For HMIM$^+$TFSI$^-$, either fit could be valid based on the HMIM$^+$ length. For unit cell 1, the volume/molecular volume=2.06~2 and for unit cell 2, the ratio=2.47~2.5. for reasons of symmetry, unit cell 1 would correspond to 2 HMIM$^+$TFSI$^-$ molecules, and unit cell 2 would correspond to 5 HMIM$^+$TFSI$^-$ molecules. For HMPyrr$^+$TFSI$^-$, for the fitted unit cell 1, the unit cell-to-molecular volume ratio=2.58~2.5 and for unit cell 2, the ratio=1.29~1.33, and based on cation length, either fit is plausible. Unit cell 1 would correspond to 5 RTIL molecules and unit cell 2 would correspond to 4 molecules in the unit cell. For CitMIM$^+$TFSI$^-$, the cation maximum length is not consistent with fitted unit cell 2, but it is consistent with unit cell 1. For this unit cell, the unit cell-to-molecular volume=2.35~2.33, corresponding to 7 RTIL molecules in the unit cell. While these data collectively place limits on the structure and unit cell size of the RTIL crystalline solid phases, another constraint that must obtain for a piezoelectric material is that the crystalline material cannot possess a center of inversion. It is more likely that unit cells with an odd number of molecules such as these RTILs would not possess a center of inversion.

TABLE 2

| | X-ray diffraction lattice fitting results | | | | | | | |
|---|---|---|---|---|---|---|---|---|
| RTIL | Fitted unit cell | a (Å) | b (Å) | c (Å) | α (deg) | β (deg) | γ (deg) | V (Å$^3$) |
| HMIM$^+$TFSI$^-$ | 1 | 10.459 | 10.459 | 6.700 | 90 | 90 | 90 | 732.95 |
| | 2 | 10.152 | 10.152 | 9.825 | 90 | 90 | 120 | 876.84 |
| HMPyrr$^+$TFSI$^-$ | 1 | 9.641 | 8.198 | 12.127 | 90 | 90 | 90 | 958.45 |
| | 2 | 11.387 | 6.032 | 8.263 | 90 | 122.15 | 90 | 480.51 |
| CitMIM$^+$TFSI$^-$ | 1 | 8.047 | 9.288 | 13.102 | 90 | 90 | 90 | 979.30 |
| | 2 | 8.291 | 9.291 | 7.403 | 90 | 90 | 120 | 440.73 |

TABLE 3

Calculated RTIL hydrodynamic volumes and
maximum RTIL cation length

| RTIL | Hydrodynamic volume ($Å^3$) | Maximum cation length ($Å$) |
| --- | --- | --- |
| HMIM$^+$TFSI$^-$ | 355 | 12.34 |
| HMPyrr$^+$TFSI$^-$ | 372 | 10.66 |
| CitMIM$^+$TFSI$^-$ | 416 | 12.48 |

Example 3

This example illustrates the direct piezoelectric effect in an RTIL. The piezoelectric apparatus 100 used in this example is illustrated in FIG. 2. The apparatus 100 includes a cell or chamber 120 containing imidazolium bis(trifluoromethylsulfonyl)imide (HMIM$^+$TFSI$^-$) as an RTIL 104A in the internal volume 104 of the cell. The apparatus 100 further includes a foam sponge 104B in the internal volume 104, with the RTIL 104A being infused or soaked into the sponge 104B. The first surface 102 of the cell is a glass plate coated with an inner-facing, electrically conductive ITO layer 102B, which serves as an electrode surface in contact with the RTIL 104A, and which is in electrical contact with an electrical device 124 (such as a voltage sensor 124B) via an external first electrode 102A. Similarly, the second surface 107 of the cell is a glass plate coated with an inner-facing, electrically conductive ITO layer 107B, which serves as an electrode surface in contact with the RTIL 104A, and which is in electrical contact with the electrical device 124 via an external second electrode 107A.

Figure 13:
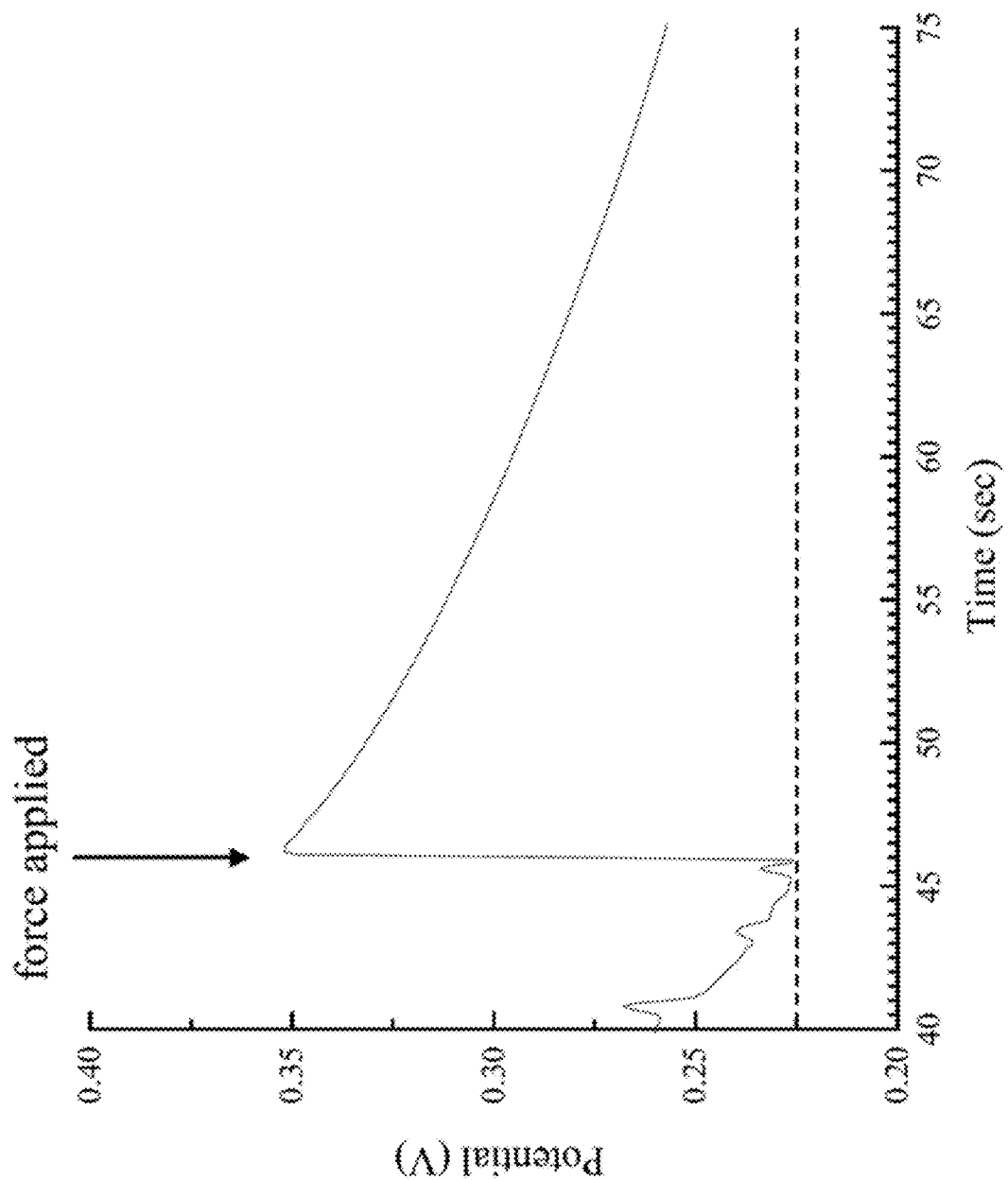
FIG. 13 is a graph showing potential measured as a function of time after an external compressive force was applied to a piezoelectric apparatus according to the disclosure.

The piezoelectric apparatus 100 was subjected to a compressive normal force F, and the resulting voltage potential was measured with the voltage sensor 124B. FIG. 13 shows the measured potential as a function of time after the compressive force was applied, thus demonstrating the direct piezoelectric effect.

Because other modifications and changes varied to fit particular operating requirements and environments will be apparent to those skilled in the art, the disclosure is not considered limited to the example chosen for purposes of illustration, and covers all changes and modifications which do not constitute departures from the true spirit and scope of this disclosure.

Accordingly, the foregoing description is given for clearness of understanding only, and no unnecessary limitations should be understood therefrom, as modifications within the scope of the disclosure may be apparent to those having ordinary skill in the art.

All patents, patent applications, government publications, government regulations, and literature references cited in this specification are hereby incorporated herein by reference in their entirety. In case of conflict, the present description, including definitions, will control.

Throughout the specification, where the compositions, processes, kits, or apparatus are described as including components, steps, or materials, it is contemplated that the compositions, processes, or apparatus can also comprise, consist essentially of, or consist of, any combination of the recited components or materials, unless described otherwise. Component concentrations can be expressed in terms of weight concentrations, unless specifically indicated otherwise. Combinations of components are contemplated to include homogeneous and/or heterogeneous mixtures, as would be understood by a person of ordinary skill in the art in view of the foregoing disclosure.

LIST OF FIGURE ELEMENTS 100 piezoelectric apparatus
102 first wall, substrate, or chamber/cell portion
102A first electrode
102B first electrically conductive layer
104 internal volume
104A ionic liquid or room temperature ionic liquid
104B porous and/or flexible solid substrate
106 gas reservoir
107 second wall, substrate, or chamber/cell portion
107A second electrode
107B second electrically conductive layer
107C slot
108 (mechanical) fastener
115 incident light
115$a$, 115$b$, 115$c$ refracted light
117 (electrically insulating) sealing structure
120 chamber or cell
124 electrical device
124A voltage and/or current source (e.g., for inducing converse piezoelectric effect)
124B electrical load (e.g., electrical device for storing, utilizing, and/or measuring electrical
potential and/or current induced by piezoelectric effect)
200 multiplexed piezoelectric apparatus
D thickness, gap width, or distance between (first and second) electrodes
F, $F_1$, $F_2$ (compressive) force applied to piezoelectric apparatus
r, z radial and axial directions

What is claimed is:

1. A piezoelectric apparatus comprising:
a chamber defining an internal volume;
an ionic liquid in the internal volume, the ionic liquid being adapted to generate either (i) a voltage or current upon application of force to the chamber, or (ii) a deformation of the ionic liquid upon application of a voltage to the ionic liquid;
a first electrode in contact with the ionic liquid at a first location; and
a second electrode in contact with the ionic liquid at a second location.

2. The piezoelectric apparatus of claim 1, wherein the ionic liquid comprises a cationic moiety selected from the group consisting of a pyridinium, pyridazinium, pyrimidinium, pyrazinium, oxazinium, thiazinium, imidazolium, pyrazolium, thiazolium, isothiazolium, oxazolium, isoxazolium, triazolium, pyrrolium, pyrrolidinium, isoquinolinium, pyrimidoazepinium, piperidinium, ammonium, phosphonium, and sulfonium cationic moieties.

3. The piezoelectric apparatus of claim 2, wherein the cationic moiety comprises one or more organic substituents each independently selected from the group consisting of alkyl groups and aryl groups.

4. The piezoelectric apparatus of claim 1, wherein the ionic liquid comprises a counter anion selected from the group consisting of sulfate, hydrogen sulfate, nitrate, fluoride, chloride, bromide, iodide, methyl sulfonate, cyanide, cyanate, thiocyanate, bis(trifluoromethanesulfonyl)imide (triflimide), fluoroborate anions, fluorophosphate anions, and trifluoromethyl sulfonate (triflate).

5. The piezoelectric apparatus of claim 1, wherein the ionic liquid comprises a counter anion containing an anionic moiety, the anionic moiety comprising one or more organic substituents each independently selected from the group consisting of alkyl groups and aryl groups.

6. The piezoelectric apparatus of claim 1, wherein the ionic liquid comprises a counter anion containing (i) one or more B, N, P, or S atoms and (ii) one or more halogen atoms.

7. The piezoelectric apparatus of claim 1, wherein the ionic liquid exhibits a piezoelectric constant ($d_{33}$) of at least 0.01 pC/N.

8. The piezoelectric apparatus of claim 1, wherein the internal volume is substantially free from materials other than ionic liquids.

9. The piezoelectric apparatus of claim 1, wherein the piezoelectric apparatus further comprises a porous, flexible solid substrate in the internal volume.

10. The piezoelectric apparatus of claim 1, wherein the internal volume is substantially free from a headspace.

11. The piezoelectric apparatus of claim 1, wherein the first electrode and the second electrode are positioned at opposing locations in the internal volume.

12. The piezoelectric apparatus of claim 1, wherein the first electrode and the second electrode each independently comprise a metal.

13. The piezoelectric apparatus of claim 1, wherein the first electrode and the second electrode each independently comprise a material selected from the group consisting of metal materials, transparent conductive metal oxides, conductive polymers, semiconducting diamonds, conductive carbons, transparent conductive carbons, and combinations thereof.

14. The piezoelectric apparatus of claim 1, wherein the first electrode and the second electrode each independently comprise a transparent conductive metal oxide selected from the group consisting of indium tin oxide (ITO), fluorine-doped indium tin oxide (FTO), indium zinc oxide (IZO), and aluminum zinc oxide (AZO).

15. The piezoelectric apparatus of claim 1, wherein the piezoelectric apparatus has at least one of:
a distance between the first electrode and the second electrode in a range of 0.05 mm to 2 mm; and
at least one linear dimension of at least 0.01 m for the internal volume.

16. The piezoelectric apparatus of claim 1, wherein:
the piezoelectric apparatus further comprises an external electrical load in electrical connection with the first electrode and the second electrode.

17. The piezoelectric apparatus of claim 16, wherein:
the chamber of the piezoelectric apparatus comprises at least one deformable or translatable wall.

18. The piezoelectric apparatus of claim 1, wherein:
the piezoelectric apparatus further comprises an external voltage source in electrical connection with the first electrode and the second electrode; and
the chamber of the piezoelectric apparatus comprises at least one deformable or translatable wall.

19. The piezoelectric apparatus of claim 16, wherein:
the chamber comprises at least one opposing, optically transparent surface.

20. A multiplexed piezoelectric apparatus comprising:
a plurality of piezoelectric apparatus of claim 1, wherein the chamber of each piezoelectric apparatus is separate from the other chambers in a selected spatial pattern such that an applied force and corresponding piezoelectric effect voltage can be correlated to a known location.

21. A multiplexed piezoelectric apparatus comprising:
a plurality of piezoelectric apparatus of claim 1, wherein the chamber of each piezoelectric apparatus is separate from the other chambers in an arrangement where the chambers are electrically connected either in series or in parallel.

22. The piezoelectric apparatus of claim 1, wherein at least one of the first electrode and the second electrode is chemically modified to control the long range molecular organization of the piezoelectric ionic liquid in contact with the at least one of the first electrode and the second electrode.

23. The piezoelectric apparatus of claim 22, wherein the at least one of the first electrode and the second electrode is chemically modified with a chiral or otherwise optically active chemical modifier.

24. The piezoelectric apparatus of claim 1, wherein:
the first electrode and the second electrode are positioned at opposing locations in the internal volume;
a distance between the first electrode and the second electrode is in a range of 0.01 mm to 10 mm;
the ionic liquid comprises a cationic moiety selected from the group consisting of a pyridinium, pyridazinium, pyrimidinium, pyrazinium, oxazinium, thiazinium, imidazolium, pyrazolium, thiazolium, isothiazolium, oxazolium, isoxazolium, triazolium, pyrrolium, pyrrolidinium, isoquinolinium, pyrimidoazepinium, piperidinium, ammonium, phosphonium, and sulfonium cationic moieties;
the cationic moiety comprises one or more organic substituents each independently selected from the group consisting of alkyl groups having 1 to 20 carbon atoms and aryl groups having 5 to 20 carbon atoms; and
the ionic liquid comprises a counter anion selected from the group consisting of sulfate, hydrogen sulfate, nitrate, fluoride, chloride, bromide, iodide, methyl sulfonate, cyanide, cyanate, thiocyanate, bis(trifluoromethanesulfonyl)imide (triflimide), fluoroborate anions, fluorophosphate anions, and trifluoromethyl sulfonate (triflate).

25. The piezoelectric apparatus of claim 24, wherein the ionic liquid exhibits a piezoelectric constant ($d_{33}$) of at least 0.3 pC/N.

26. The piezoelectric apparatus of claim 24, wherein the ionic liquid exhibits a piezoelectric constant ($d_{33}$) in a range of 0.05 pC/N to 1 pC/N.

27. The piezoelectric apparatus of claim 24, wherein a volume: surface area ratio for the internal volume relative to half of total electrode surface area is in a range of 0.05 mm to 2 mm.

28. The piezoelectric apparatus of claim 1, wherein:
the ionic liquid comprises a cationic moiety comprising imidazolium;
the cationic moiety comprises one or more organic substituents each independently selected from the group consisting of alkyl groups having 1 to 20 carbon atoms and aryl groups having 5 to 20 carbon atoms, with the proviso that the cationic moiety is free from chiral organic substituents; and
the ionic liquid comprises a counter anion comprising bis(trifluoromethanesulfonyl)imide (triflimide).

29. The piezoelectric apparatus of claim 16, wherein:
the first electrode and the second electrode are not in electrical connection with an external voltage or power source.

30. The piezoelectric apparatus of claim 1, wherein:

the chamber comprises (i) at least one optically transparent surface and (ii) at least one opaque or reflective surface opposing the at least one optically transparent surface.

31. The piezoelectric apparatus of claim 1, wherein:

the chamber comprises at least two opposing optically transparent surfaces.

32. The piezoelectric apparatus of claim 20, wherein apparatus is in the form of a touch-sensitive display.

33. The piezoelectric apparatus of claim 1, further comprising:

an electrical device in electrical connection with the first electrode and the second electrode, the electrical device being selected from the group consisting of electrical batteries, electrical motors, sensors, lights, and combinations thereof.

34. The piezoelectric apparatus of claim 33, further comprising:

an electrical system component in electrical connection with the first electrode and the second electrode, the electrical system component being selected from the group consisting of AC-to-DC converters, DC-to-AC converters, voltage ladders, computing components, and combinations thereof.

35. The piezoelectric apparatus of claim 34, wherein the piezoelectric apparatus is configured as a sensor selected from the group consisting of a force sensor, an optical sensor, an impact sensor, and a pressure sensor.

36. The piezoelectric apparatus of claim 1, further comprising:

a wearable garment in electrical connection with the first electrode and the second electrode.

37. The piezoelectric apparatus of claim 36, wherein the wearable garment is selected from the group consisting of shoes, footwear, and a helmet.

38. The piezoelectric apparatus of claim 1, wherein the ionic liquid comprises a counter anion selected from the group consisting of a first counter anion containing one N atom, one C atom, and one O atom, and a second counter anion containing one N atom, one C atom, and one S atom.

* * * * *